US012495579B2

(12) United States Patent
Li et al.

(10) Patent No.: US 12,495,579 B2
(45) Date of Patent: Dec. 9, 2025

(54) SEMICONDUCTOR DEVICE WITH LEAKAGE CURRENT SUPPRESSION AND METHOD OF FORMING THE SAME

(71) Applicant: Taiwan Semiconductor Manufacturing Co., Ltd., Hsin-Chu (TW)

(72) Inventors: Shang-Rong Li, Hsinchu (TW); Shih-Hao Lin, Hsinchu (TW); Wen-Chun Keng, Hsinchu County (TW); Chih-Chuan Yang, Hsinchu (TW); Chih-Hsiang Huang, Hsinchu County (TW); Ping-Wei Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 609 days.

(21) Appl. No.: 17/721,778

(22) Filed: Apr. 15, 2022

(65) Prior Publication Data

US 2022/0416046 A1     Dec. 29, 2022

Related U.S. Application Data

(60) Provisional application No. 63/214,336, filed on Jun. 24, 2021.

(51) Int. Cl.
*H10D 30/67* (2025.01)
*H10D 84/01* (2025.01)
*H10D 84/03* (2025.01)

(52) U.S. Cl.
CPC ..... *H10D 30/6735* (2025.01); *H10D 30/6713* (2025.01); *H10D 30/6757* (2025.01);
(Continued)

(58) Field of Classification Search
CPC .................................. H01L 29/42392
See application file for complete search history.

(56) References Cited

U.S. PATENT DOCUMENTS 8,716,841 B1   5/2014   Chang et al.
8,728,332 B2   5/2014   Lin et al.
(Continued)

FOREIGN PATENT DOCUMENTS

CN     112349590 A  *  2/2021   ............. H10D 30/62
CN     112349591 A  *  2/2021

OTHER PUBLICATIONS

Machine language translation of CN-112349590-A.*
CN-112349591-A Machine Translation (Year: 2021).*
CN 112349590 A Machine Translation (Year: 2021).*

*Primary Examiner* — Erik Kielin
(74) *Attorney, Agent, or Firm* — HAYNES AND BOONE, LLP

(57) ABSTRACT

A method of manufacturing a semiconductor device includes forming a fin, the fin having an epitaxial portion and a base portion protruding from a substrate. Sidewalls of the base portion are tapered with respect to sidewalls of the epitaxial portion. The method also includes depositing a polymeric material on the sidewalls of the epitaxial portion, performing an etching process to modify a profile of the sidewalls of the base portion, such that the sidewalls of the base portion are laterally recessed with a narrowest width of the base portion located under a top surface of the base portion, removing the polymeric material from the sidewalls of the epitaxial portion, depositing an isolation feature on the sidewalls of the base portion, and forming a gate structure engaging the epitaxial portion.

20 Claims, 32 Drawing Sheets

(52) U.S. Cl.
CPC ....... *H10D 84/0128* (2025.01); *H10D 84/013* (2025.01); *H10D 84/0158* (2025.01); *H10D 84/038* (2025.01)

(56) References Cited

U.S. PATENT DOCUMENTS

| | | | |
|---|---|---|---|
| 8,736,084 B2 | 5/2014 | Cheng et al. | |
| 8,762,900 B2 | 6/2014 | Shin et al. | |
| 8,764,995 B2 | 7/2014 | Chang et al. | |
| 8,767,178 B2 | 7/2014 | Lin et al. | |
| 8,772,109 B2 | 7/2014 | Colinge | |
| 8,785,285 B2 | 7/2014 | Tsai et al. | |
| 8,796,666 B1 | 8/2014 | Huang et al. | |
| 8,802,354 B2 | 8/2014 | Chang | |
| 8,812,999 B2 | 8/2014 | Liu et al. | |
| 8,816,444 B2 | 8/2014 | Wann et al. | |
| 8,822,243 B2 | 9/2014 | Yan et al. | |
| 8,823,065 B2 | 9/2014 | Wang et al. | |
| 8,828,625 B2 | 9/2014 | Lu et al. | |
| 8,836,016 B2 | 9/2014 | Wu et al. | |
| 8,837,810 B2 | 9/2014 | Chen et al. | |
| 8,841,047 B2 | 9/2014 | Yu et al. | |
| 8,841,701 B2 | 9/2014 | Lin et al. | |
| 8,847,293 B2 | 9/2014 | Lee et al. | |
| 8,850,366 B2 | 9/2014 | Liu et al. | |
| 8,853,025 B2 | 10/2014 | Zhang et al. | |
| 8,860,148 B2 | 10/2014 | Hu et al. | |
| 8,877,409 B2 | 11/2014 | Hsu et al. | |
| 8,895,234 B2 | 11/2014 | Chang et al. | |
| 8,906,595 B2 | 12/2014 | Liu et al. | |
| 8,945,803 B2 | 2/2015 | Chen et al. | |
| 8,954,899 B2 | 2/2015 | Wu et al. | |
| 8,962,400 B2 | 2/2015 | Tsai et al. | |
| 8,987,142 B2 | 3/2015 | Lee et al. | |
| 8,987,689 B2 | 3/2015 | Chen et al. | |
| 9,012,132 B2 | 4/2015 | Chang | |
| 9,028,915 B2 | 5/2015 | Chang et al. | |
| 9,046,789 B2 | 6/2015 | Lin et al. | |
| 9,053,279 B2 | 6/2015 | Chang et al. | |
| 9,093,514 B2 | 7/2015 | Tsai et al. | |
| 9,093,530 B2 | 7/2015 | Huang et al. | |
| 9,099,530 B2 | 8/2015 | Lin et al. | |
| 9,105,490 B2 | 8/2015 | Wang et al. | |
| 9,128,384 B2 | 9/2015 | Lin et al. | |
| 9,134,633 B2 | 9/2015 | Lin et al. | |
| 9,146,469 B2 | 9/2015 | Liu et al. | |
| 9,153,478 B2 | 10/2015 | Liu et al. | |
| 9,184,054 B1 | 11/2015 | Huang et al. | |
| 9,213,234 B2 | 12/2015 | Chang | |
| 9,223,220 B2 | 12/2015 | Chang | |
| 9,230,867 B2 | 1/2016 | Cheng et al. | |
| 9,236,267 B2 | 1/2016 | De et al. | |
| 9,236,300 B2 | 1/2016 | Liaw | |
| 9,245,805 B2 | 1/2016 | Yeh et al. | |
| 9,256,123 B2 | 2/2016 | Shih et al. | |
| 9,256,133 B2 | 2/2016 | Chang | |
| 9,269,537 B2 | 2/2016 | Tseng et al. | |
| 9,287,234 B2 | 3/2016 | Wu et al. | |
| 9,304,403 B2 | 4/2016 | Lin et al. | |
| 9,305,799 B2 | 4/2016 | Chen et al. | |
| 9,336,993 B2 | 5/2016 | Yu | |
| 9,367,655 B2 | 6/2016 | Shih et al. | |
| 9,367,661 B2 | 6/2016 | Jou et al. | |
| 9,390,217 B2 | 7/2016 | Wang et al. | |
| 9,404,743 B2 | 8/2016 | Chiu et al. | |
| 9,501,601 B2 | 11/2016 | Fredrickson et al. | |
| 9,520,482 B1 | 12/2016 | Chang et al. | |
| 9,529,268 B2 | 12/2016 | Chang et al. | |
| 9,529,959 B2 | 12/2016 | Wang et al. | |
| 9,536,759 B2 | 1/2017 | Yang et al. | |
| 9,548,303 B2 | 1/2017 | Lee et al. | |
| 9,576,814 B2 | 2/2017 | Wu et al. | |
| 2011/0097889 A1* | 4/2011 | Yuan | H01L 21/845 257/E21.19 |
| 2014/0308806 A1* | 10/2014 | Chang | H01L 29/7853 438/585 |
| 2019/0198639 A1 | 6/2019 | Kim et al. | |
| 2020/0135849 A1* | 4/2020 | Chiang | H01L 29/0673 |
| 2020/0343386 A1* | 10/2020 | Wang | H01L 21/02603 |
| 2020/0357655 A1 | 11/2020 | Chen et al. | |
| 2021/0013324 A1 | 1/2021 | Kim et al. | |
| 2021/0151561 A1* | 5/2021 | Li | H10D 64/017 |

\* cited by examiner

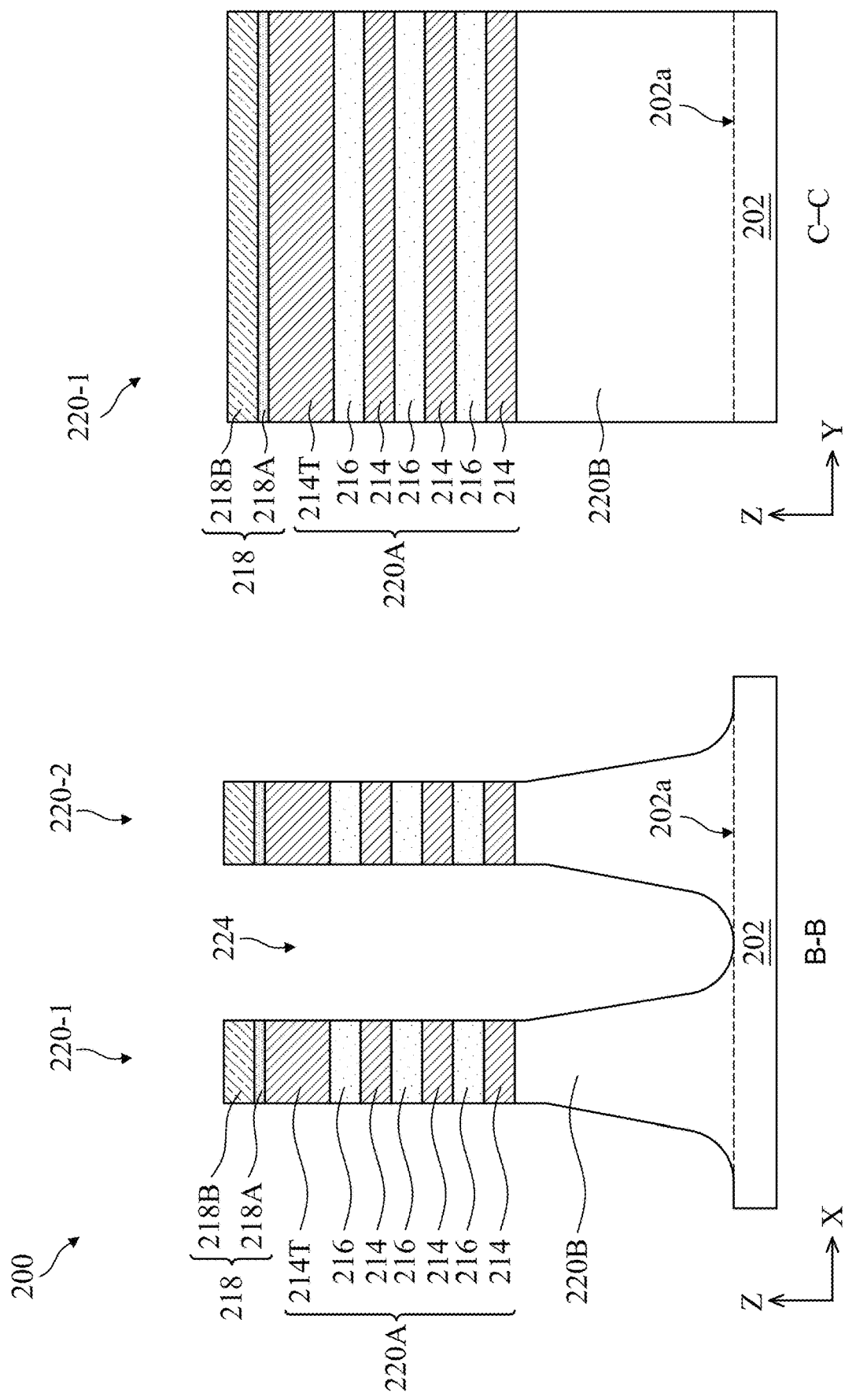

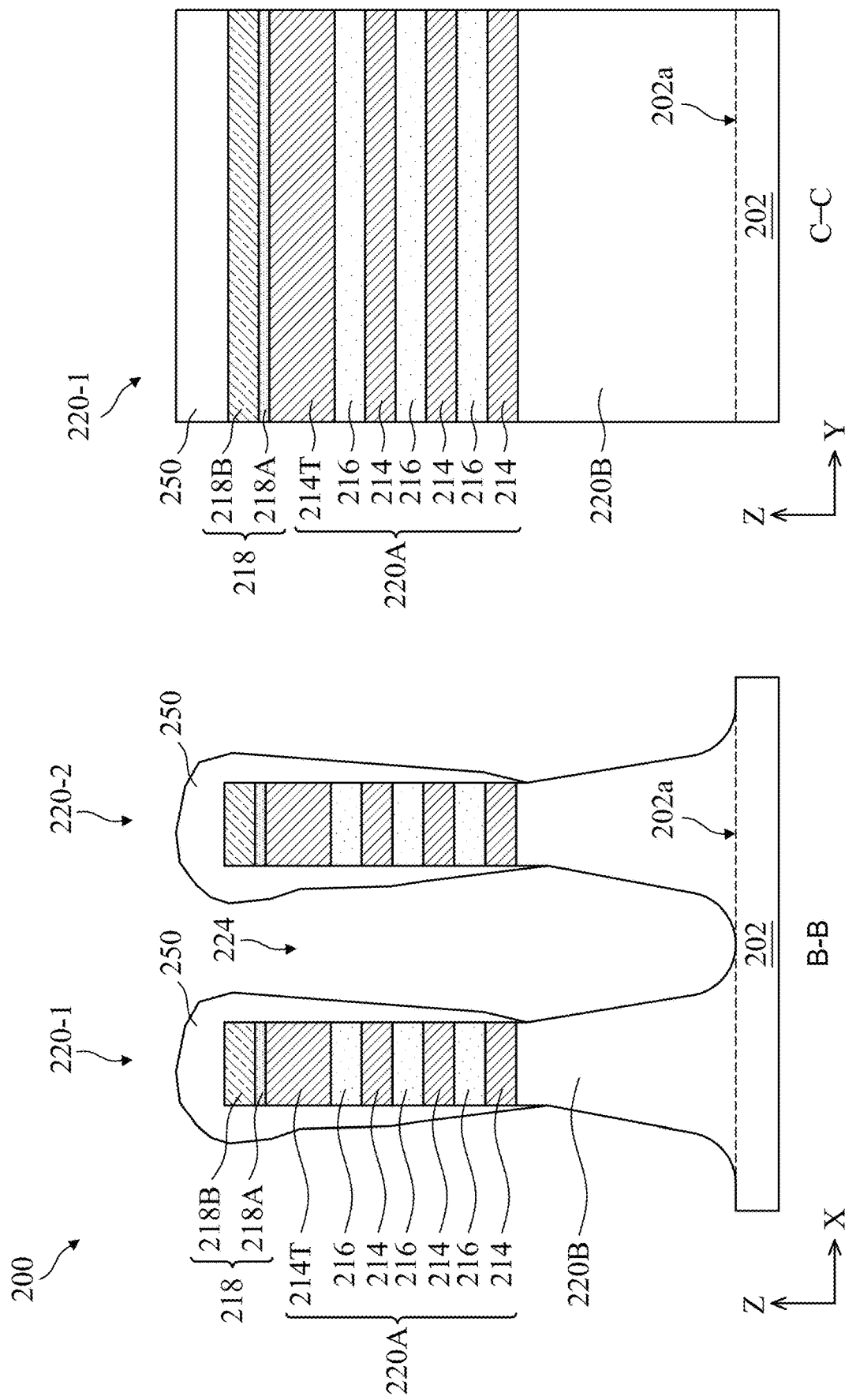

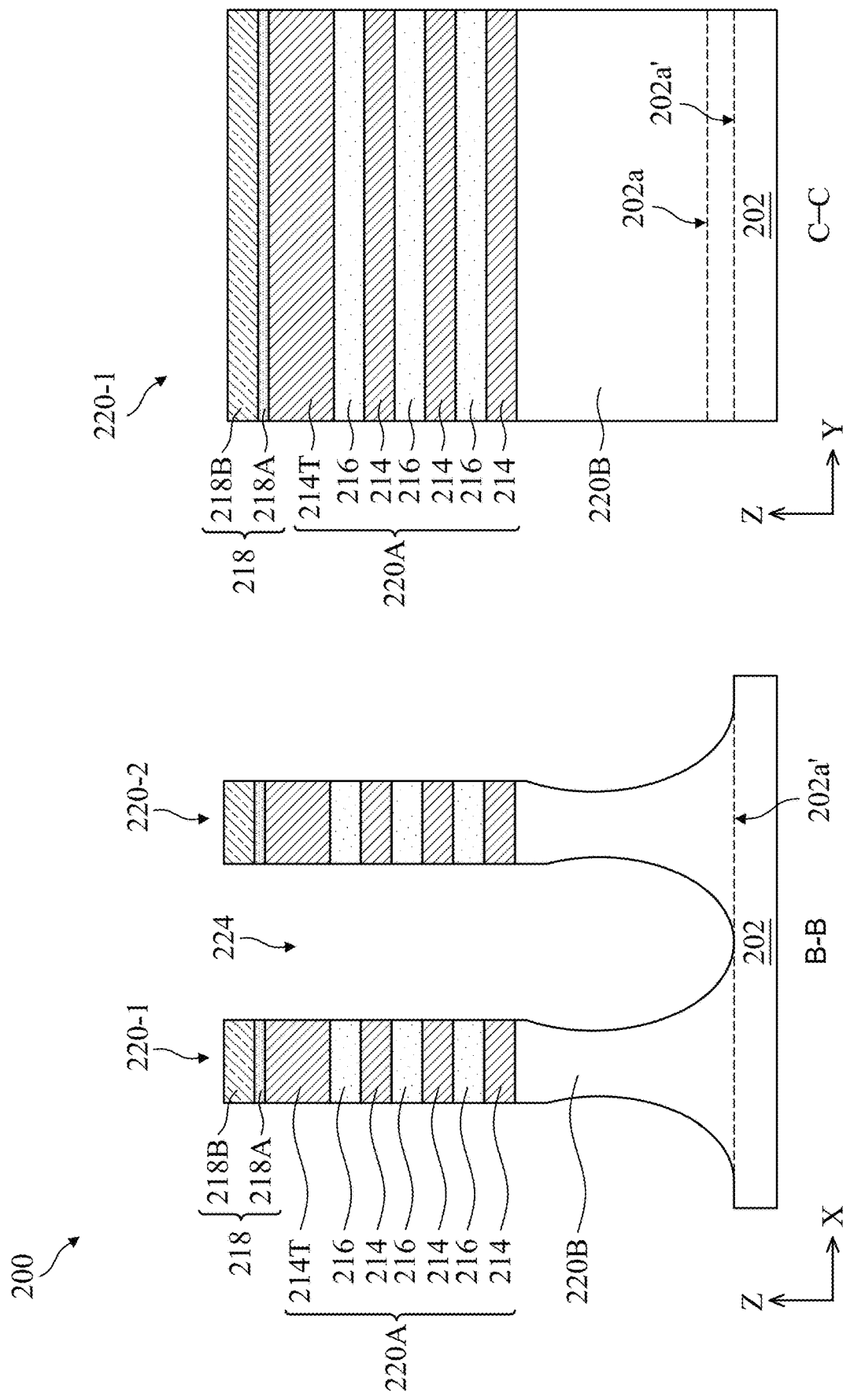

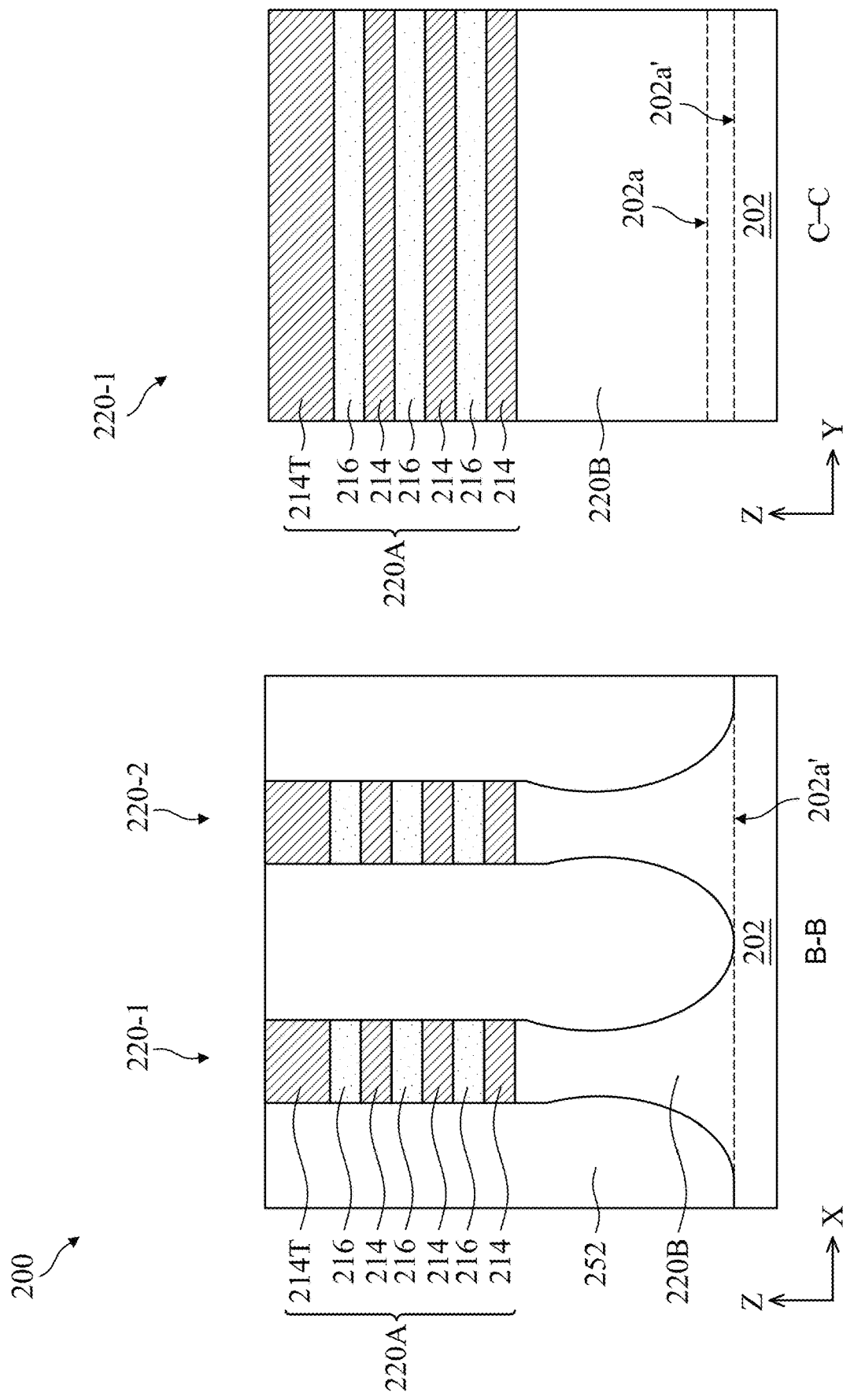

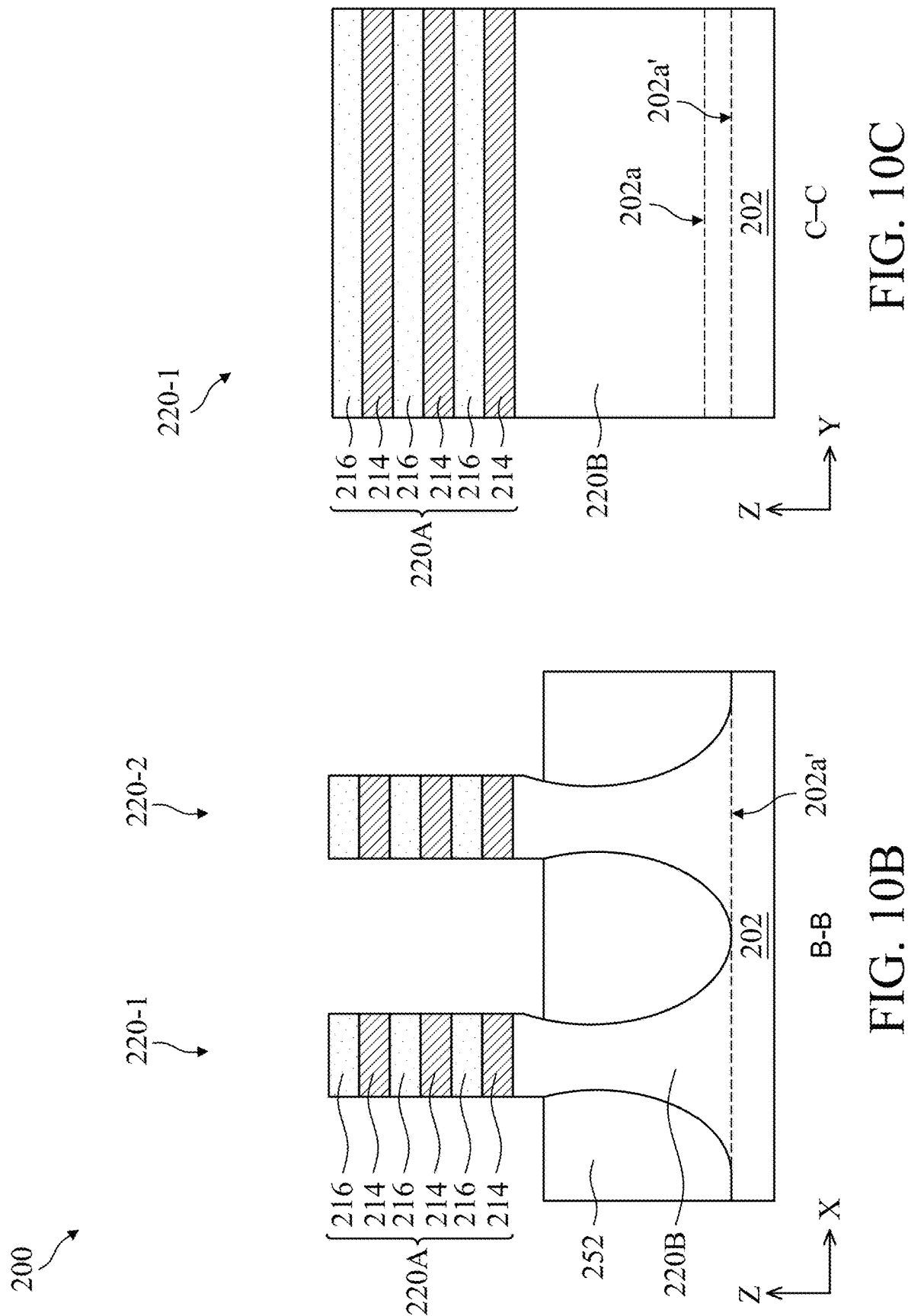

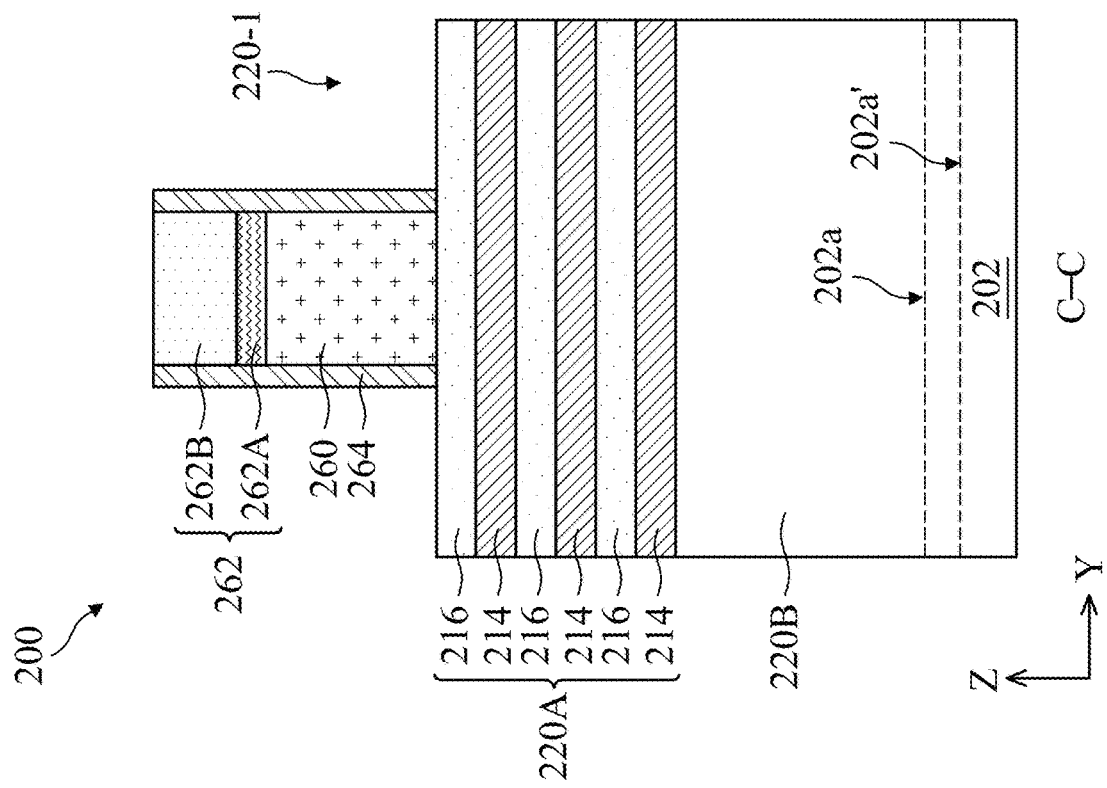
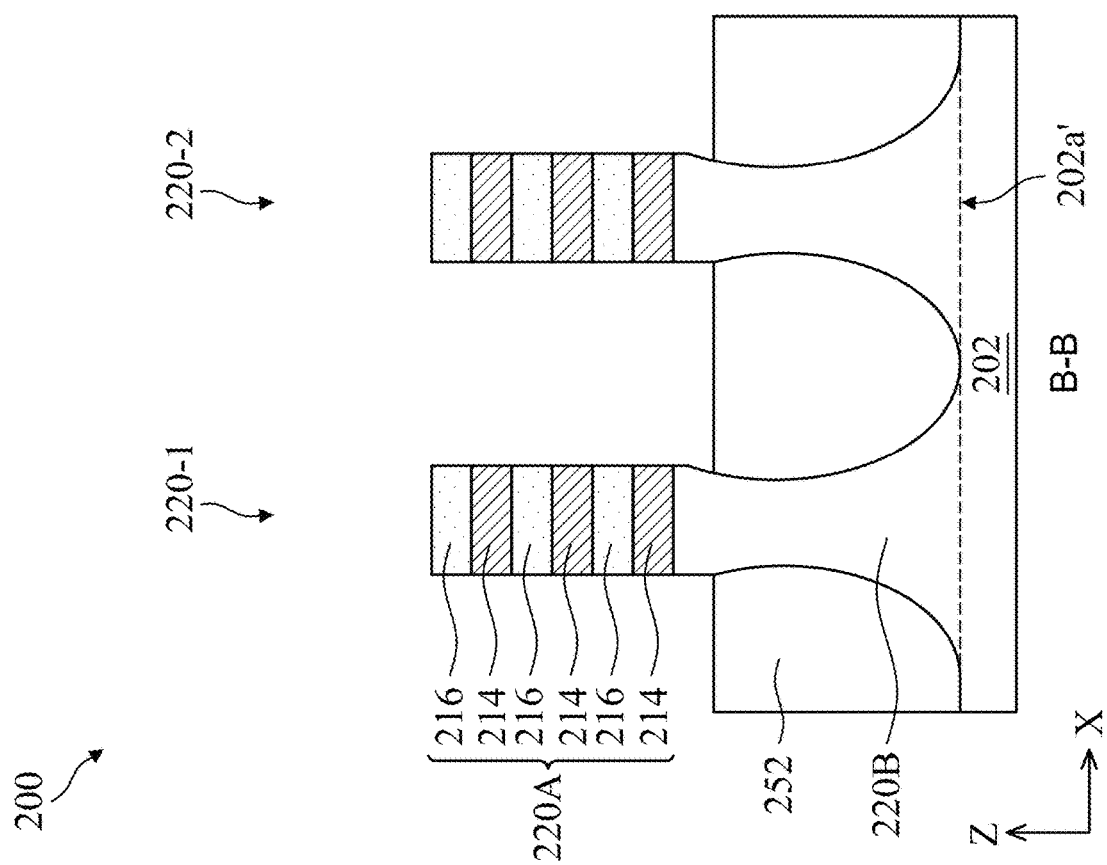
FIG. 12C
FIG. 12B

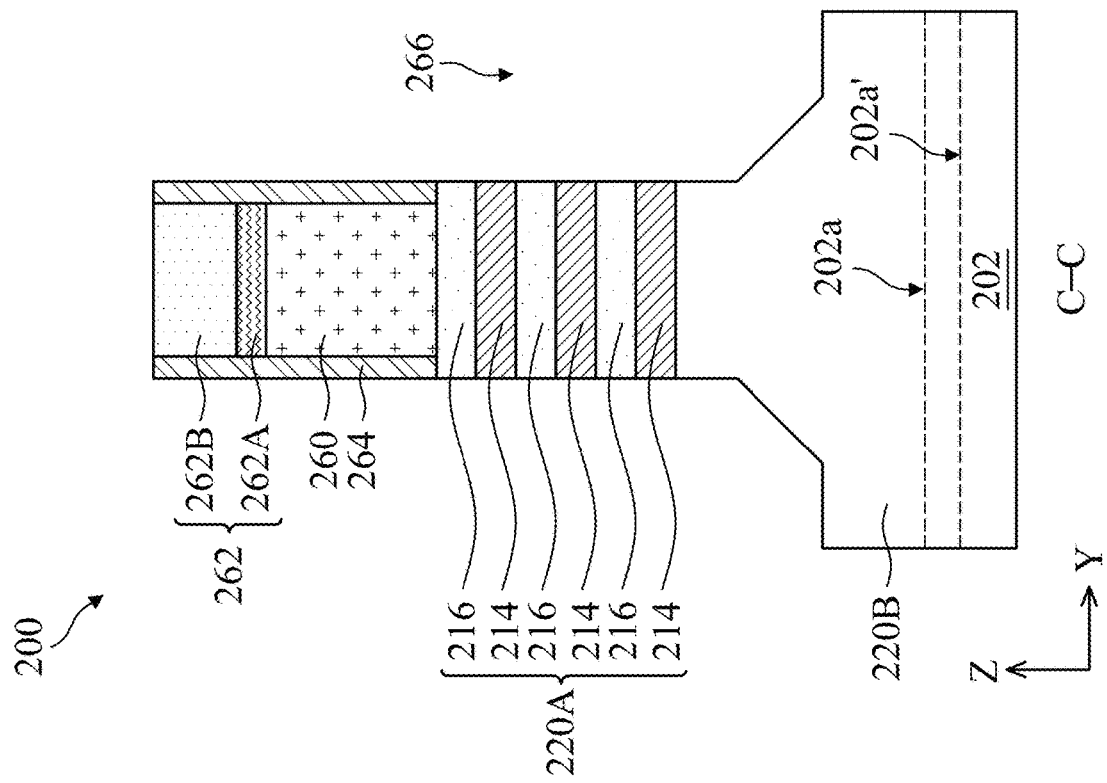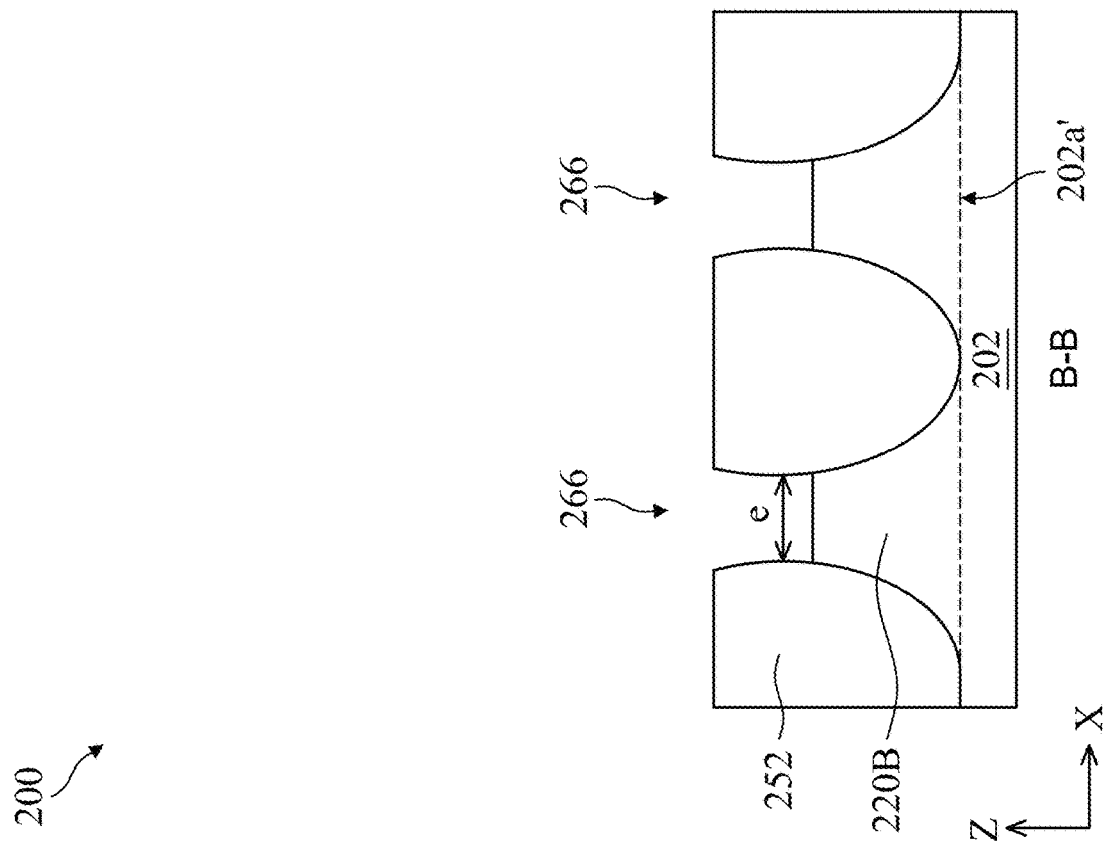
FIG. 13C
FIG. 13B

SEMICONDUCTOR DEVICE WITH LEAKAGE CURRENT SUPPRESSION AND METHOD OF FORMING THE SAME

PRIORITY DATA

This application claims priority to U.S. Provisional Patent Application No. 63/214,336, filed on Jun. 24, 2021, entitled "Device With Active Regions Of Modified Profiles", the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as IC technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Gate-all-around (GAA) transistors are examples of multi-gate devices that have become popular and promising candidates for high-performance and low-leakage applications. GAA transistors get their name from the gate structures which can extend around the channel region providing access to the stacked channel layers on four sides. Compared to planar transistors, such configuration provides better control of the channel region and drastically reduces SCEs (in particular, by reducing sub-threshold leakage). As the semiconductor industry further progresses into sub-10 nanometer (nm) technology process nodes in pursuit of higher device density, higher performance, and lower costs, integration of fabricating the GAA features around stacked channel layers can be challenging. For example, among GAA features, a gate structure extending around the bottommost channel layer may also engage a top portion of the semiconductor substrate thereunder, causing strong leakage current under the stacked channel layers. Therefore, while the current methods have been satisfactory in many respects, challenges with respect to performance of the resulting device may not be satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A, 5B, 5C, 6A, 6B, 6C, 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, and 18C illustrate cross-sectional views of a semiconductor structure during a fabrication process according to the method in FIG. 1, in accordance with one or more aspects of the present disclosure.

DETAILED DESCRIPTION

Figure 1:
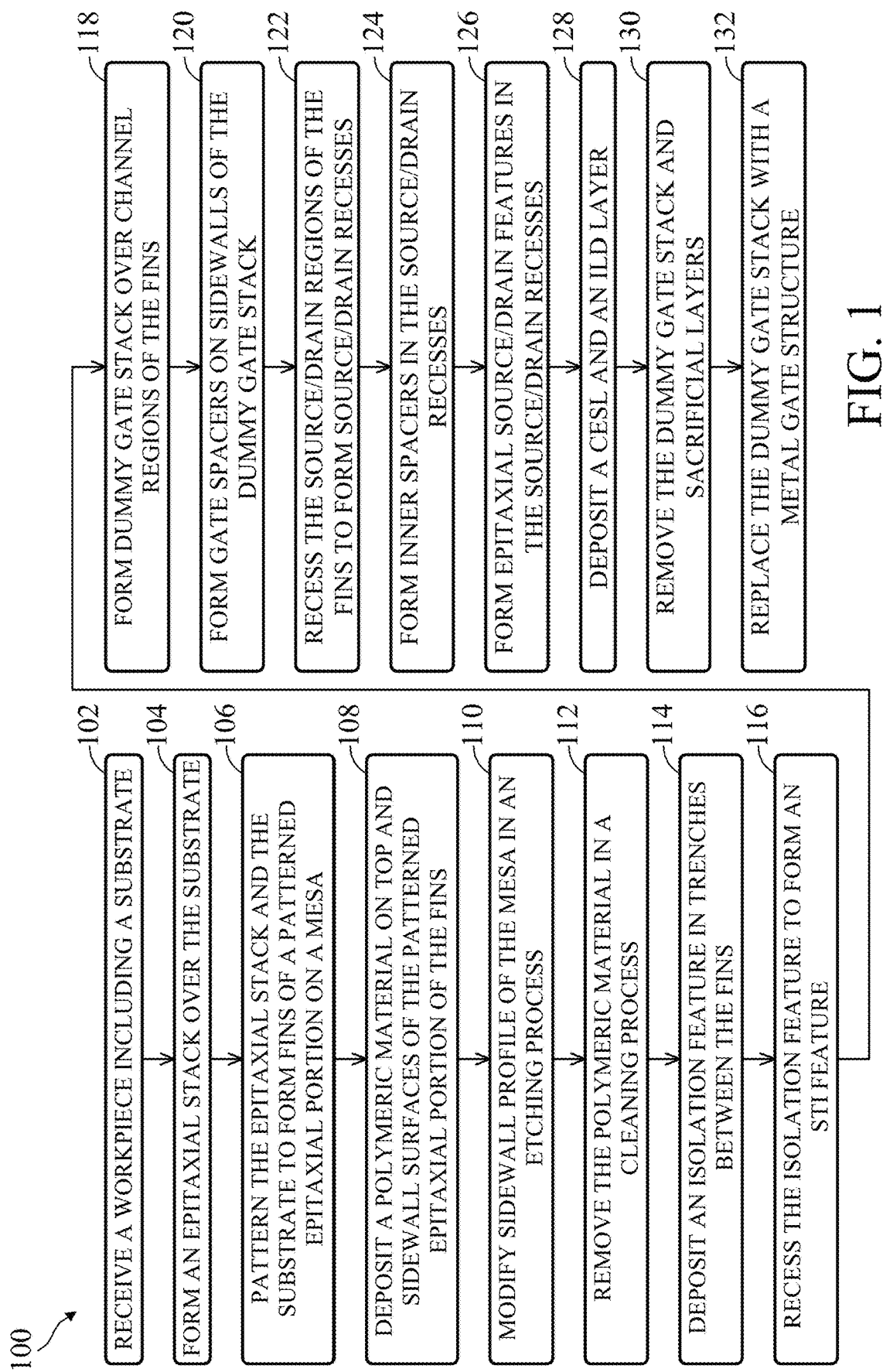
FIG. 1 shows a flow chart of an example method for making a semiconductor device, in accordance with one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor fabrication of multi-gate transistors in a semiconductor device. As used herein, a semiconductor device refers to, for example, one or more transistors, integrated circuits, a semiconductor chip (e.g., memory chip, logic chip on a semiconductor die), a stack of semiconductor chips, a semiconductor package, a semiconductor wafer, and the like. The term "multi-gate transistor" refers to a transistor, such as a field effect transistor (FET) that has gate material(s) disposed on multiple sides of a channel region of the transistor. A GAA transistor is a type of multi-gate transistor that has a gate structure extending around the channel region providing access to the stacked channel layers on four sides. The details of the structure and fabrication methods of the present disclosure are described below in conjunction with the accompanied drawings, which illustrate a process of making GAA transistors, according to some embodiments. A GAA transistor has vertically-stacked horizontally-oriented channel layers. The term "channel layer" is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. In some examples, the channel layer is referred to as a "nanowire", a "nanosheet", and the like that as used herein includes channel layers of various geometries (e.g., cylindrical, bar-shaped) and various dimensions. GAA transistors are promising candidates to take CMOS to the next stage of the roadmap due to their better gate control ability, lower leakage current, and fully FinFET device layout compatibility. For the purposes of simplicity, the present disclosure uses GAA devices as an example. Those of ordinary skill in the art should appreciate that they may readily use the present disclosure as a basis for designing or modifying other processes and structures (such as other types of multi-gate transistors) for carrying out the same purposes and/or achieving the same advantages of the embodiments introduced herein. Among GAA features, a gate structure extending around the stacked channel structures may also directly engage a top portion of a semiconductor substrate under the bottommost channel layer (or referred to as a fin-shape base or a mesa), causing strong leakage current flowing into the semiconductor substrate. An object of the present disclosure is to devise a mesa with a modified profile so as to suppress the leakage current through the mesa.

Figure 2:
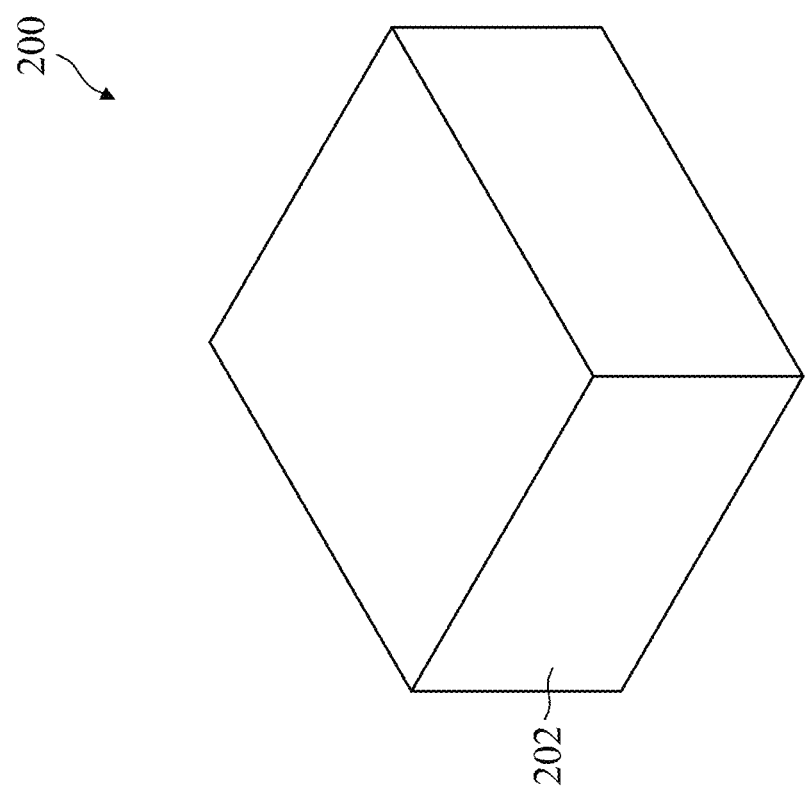
FIGS. 2, 3, and 4 illustrate perspective views of a semiconductor structure during a fabrication process according to the method in FIG. 1, in accordance with one or more aspects of the present disclosure.
Figure 2:
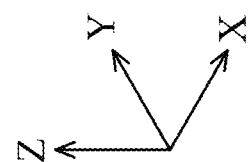
Figure 3:
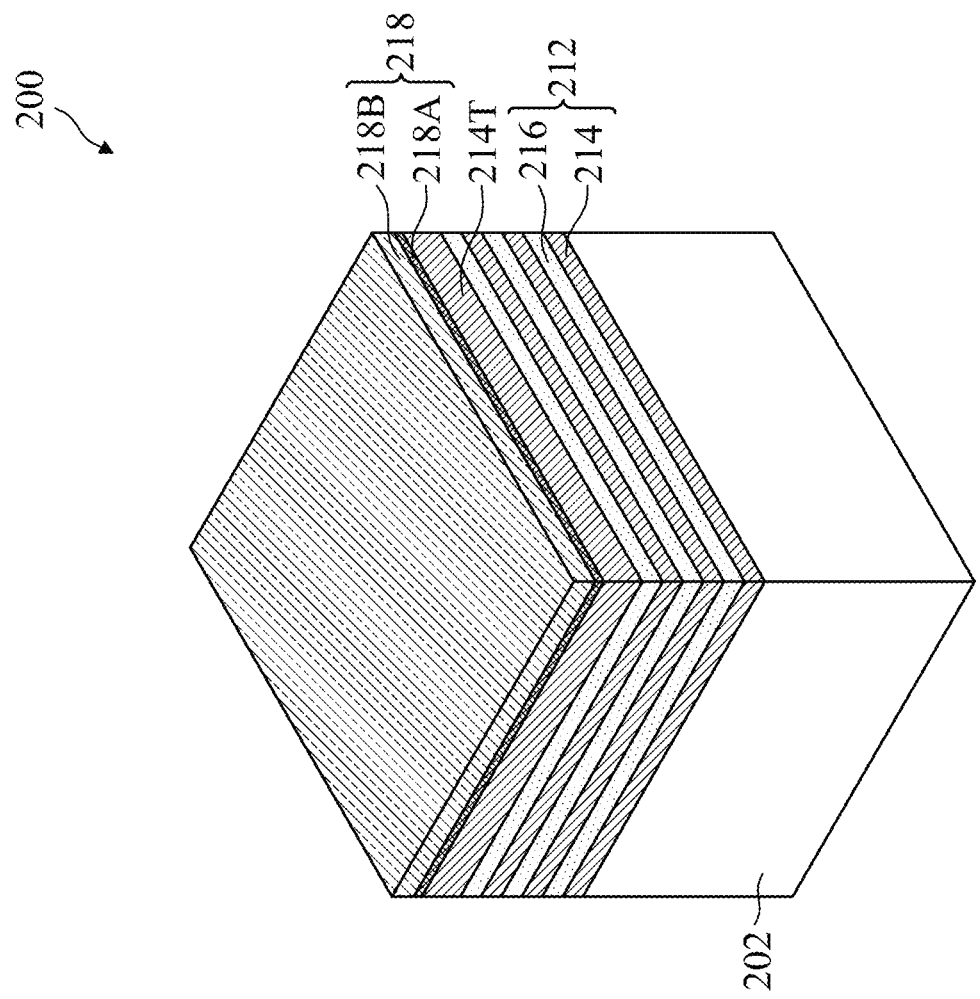
Figure 4:
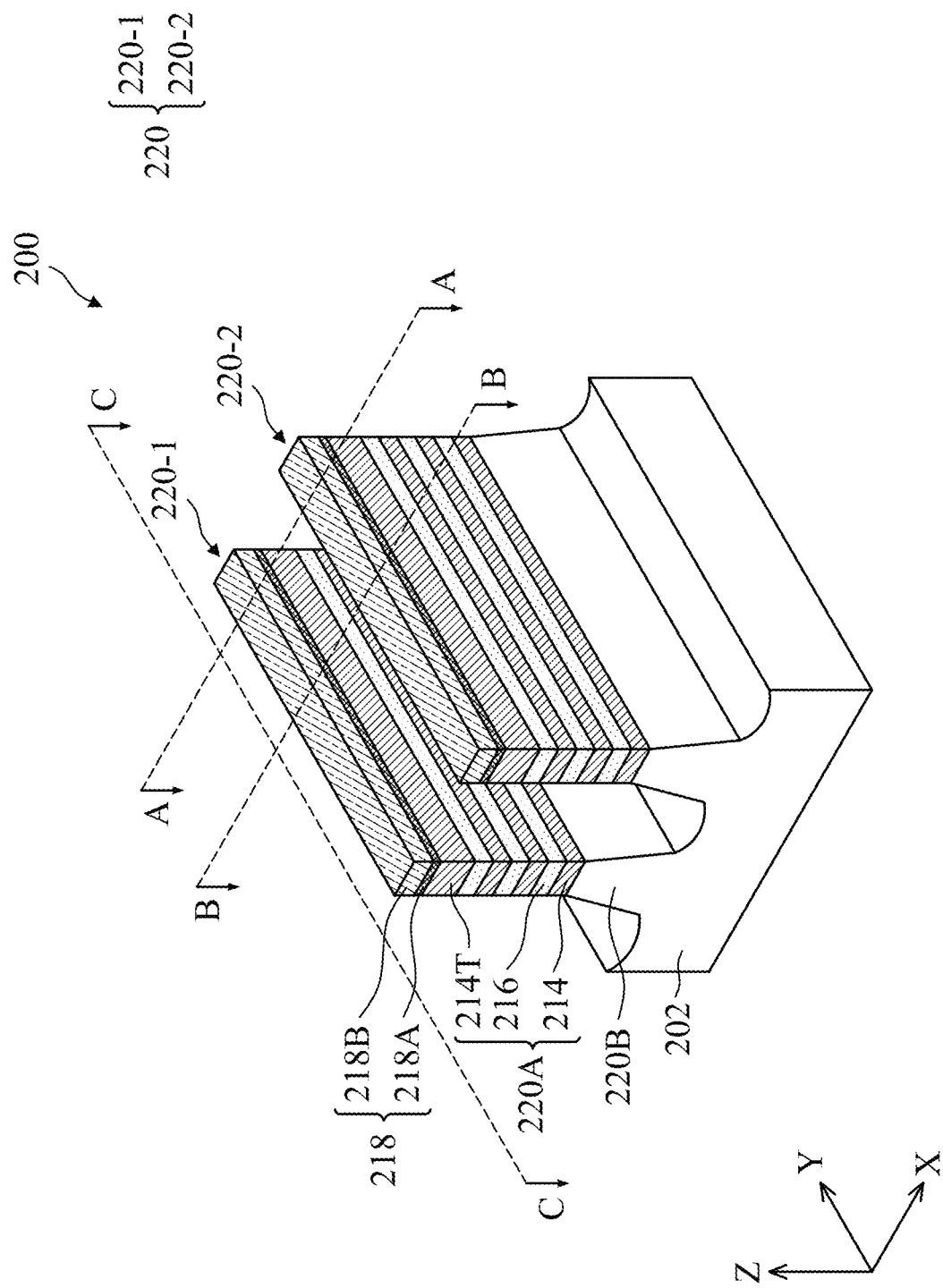
Figure 5A:
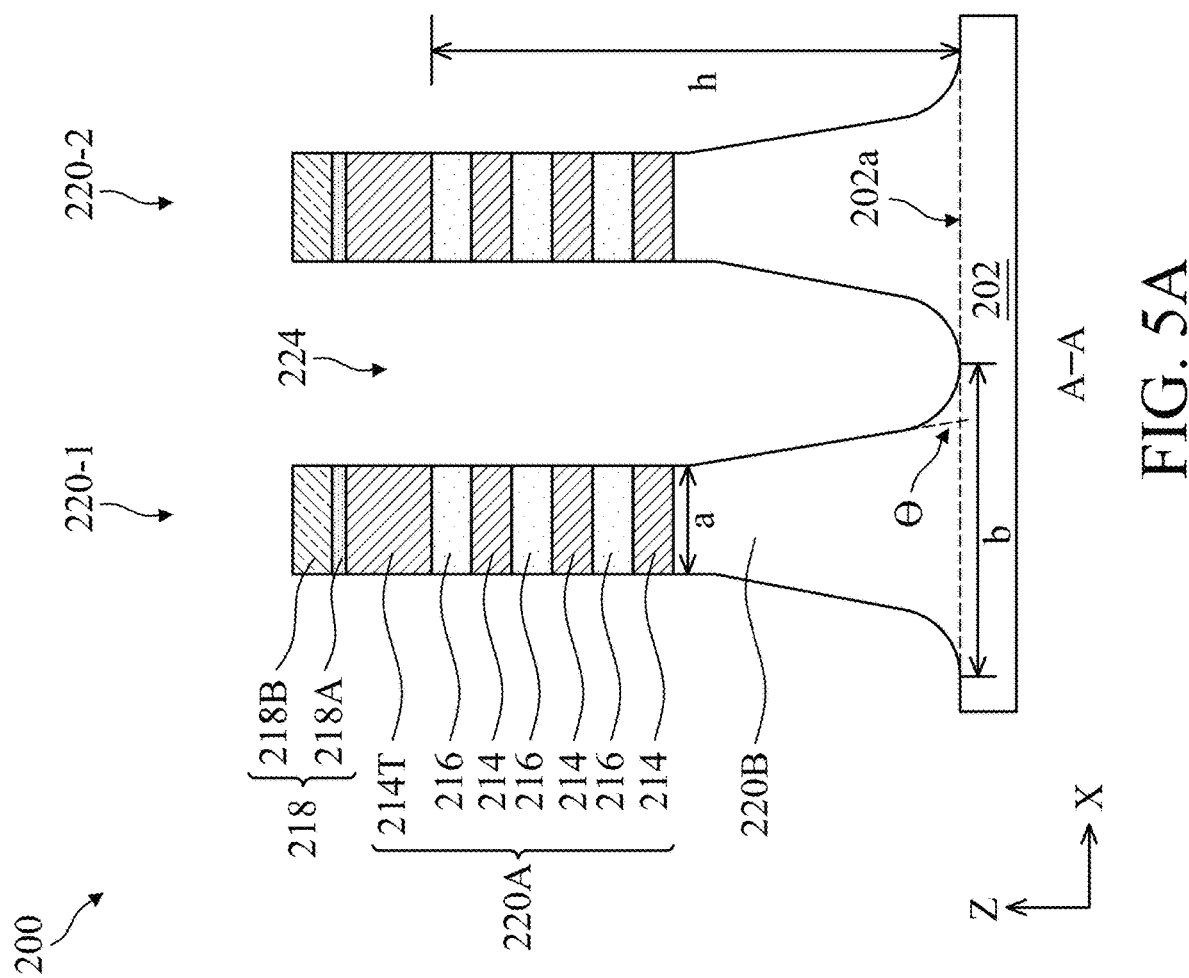
Figure 6A:
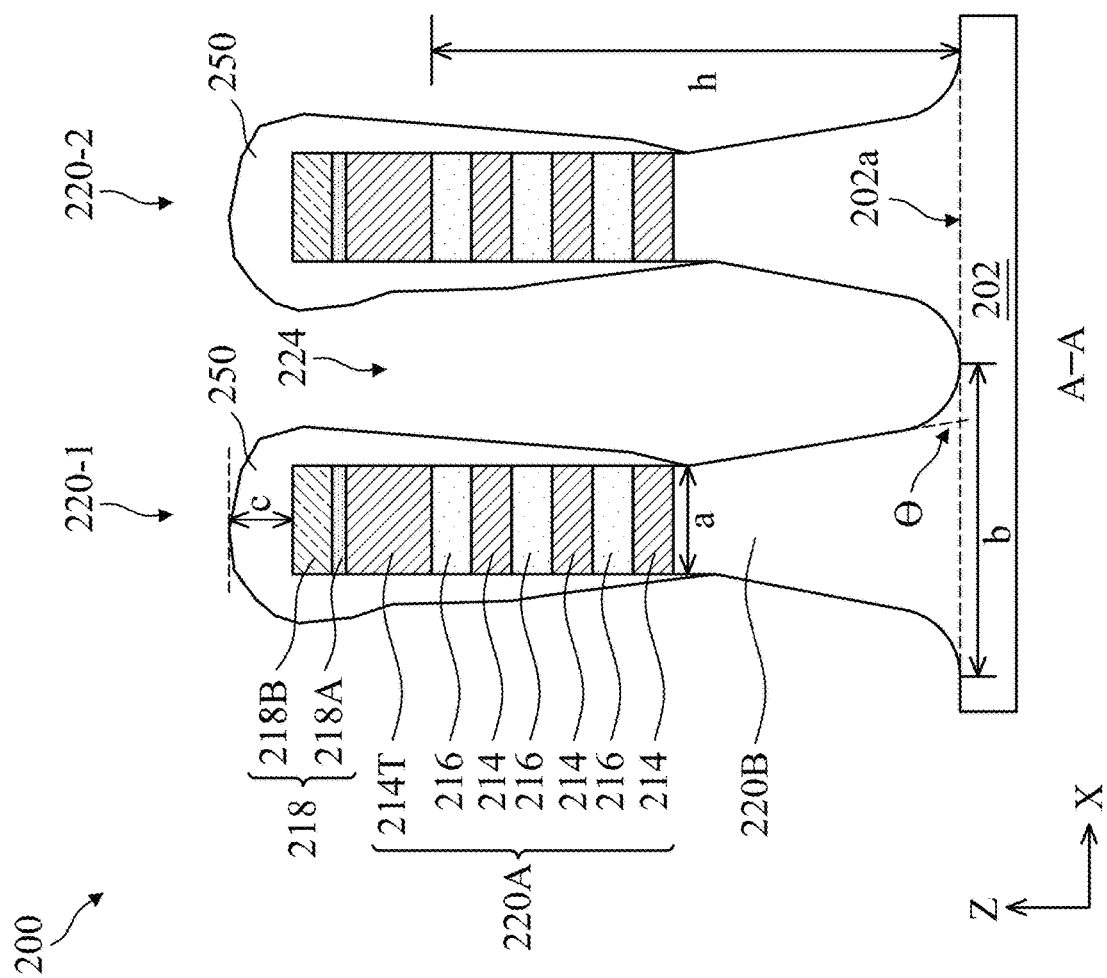
Figure 7A:
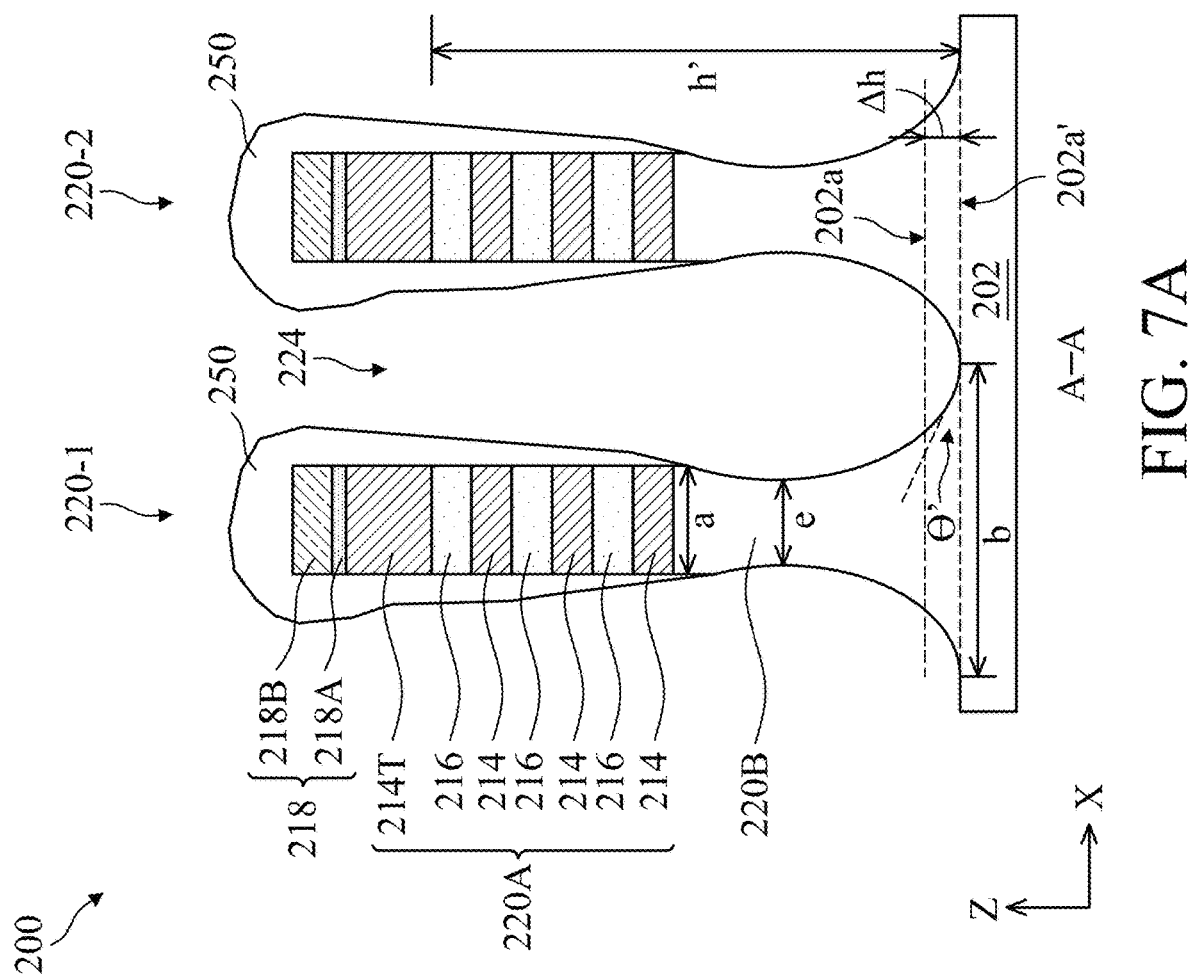
Figures 7B, 7C:
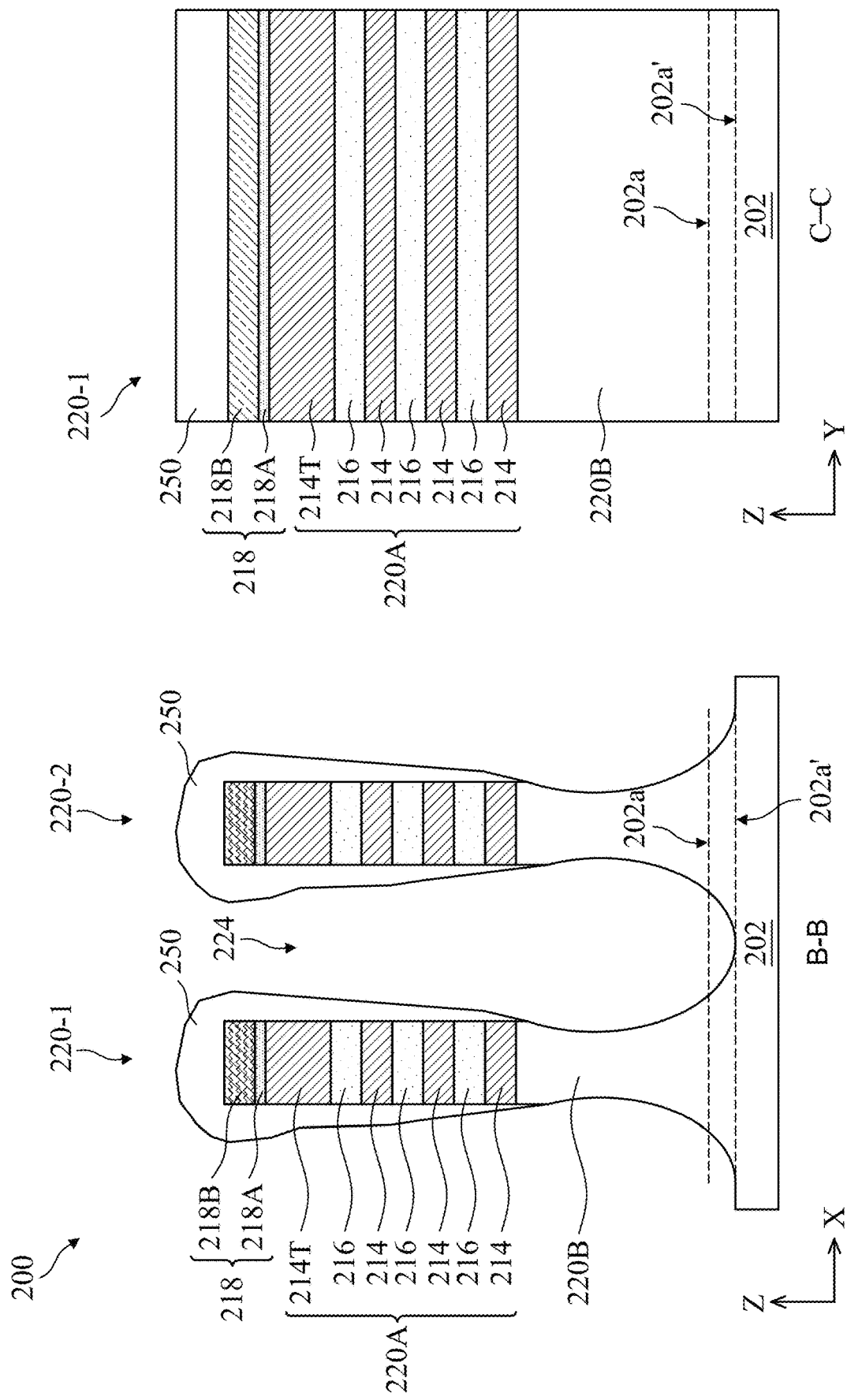
Figure 8A:
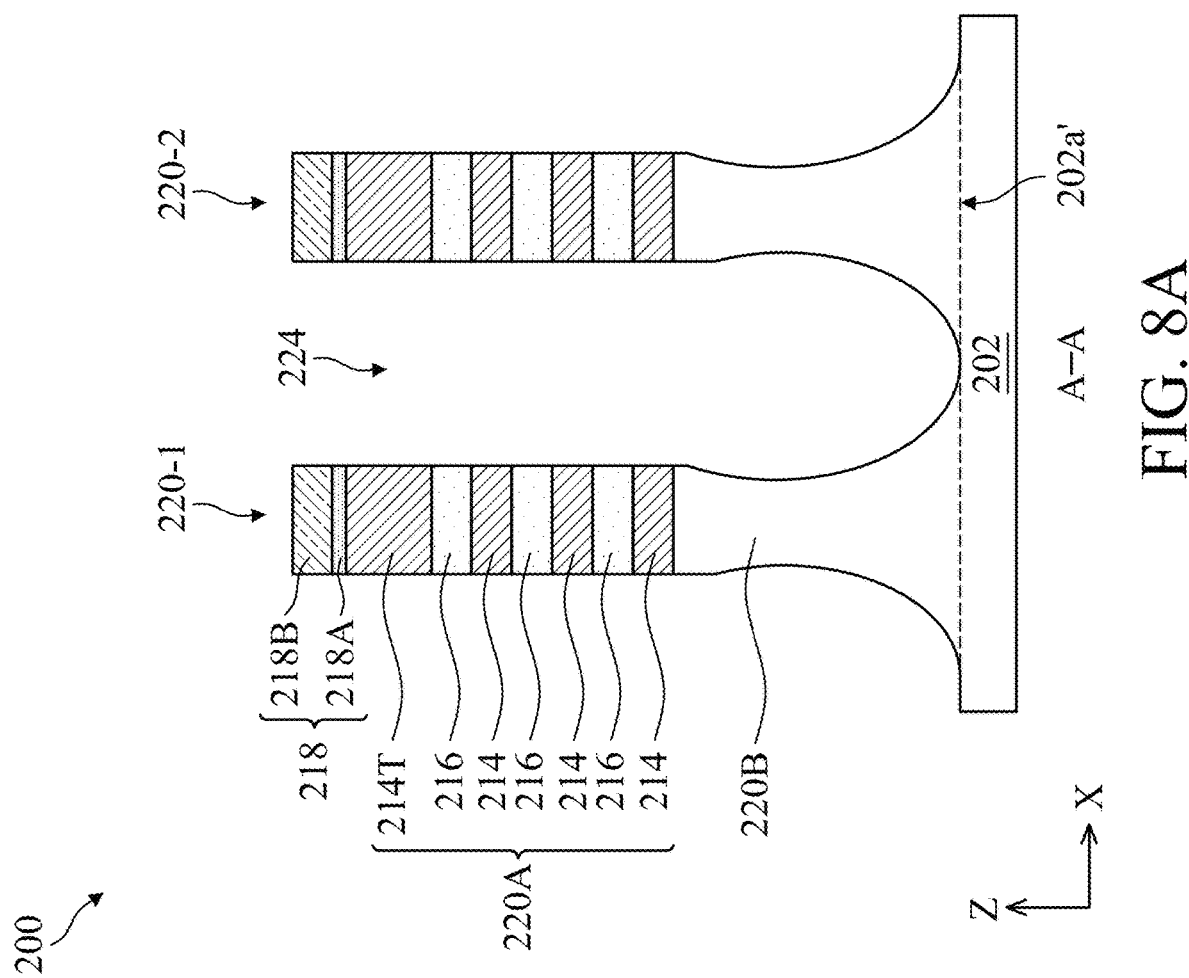
Figure 9A:
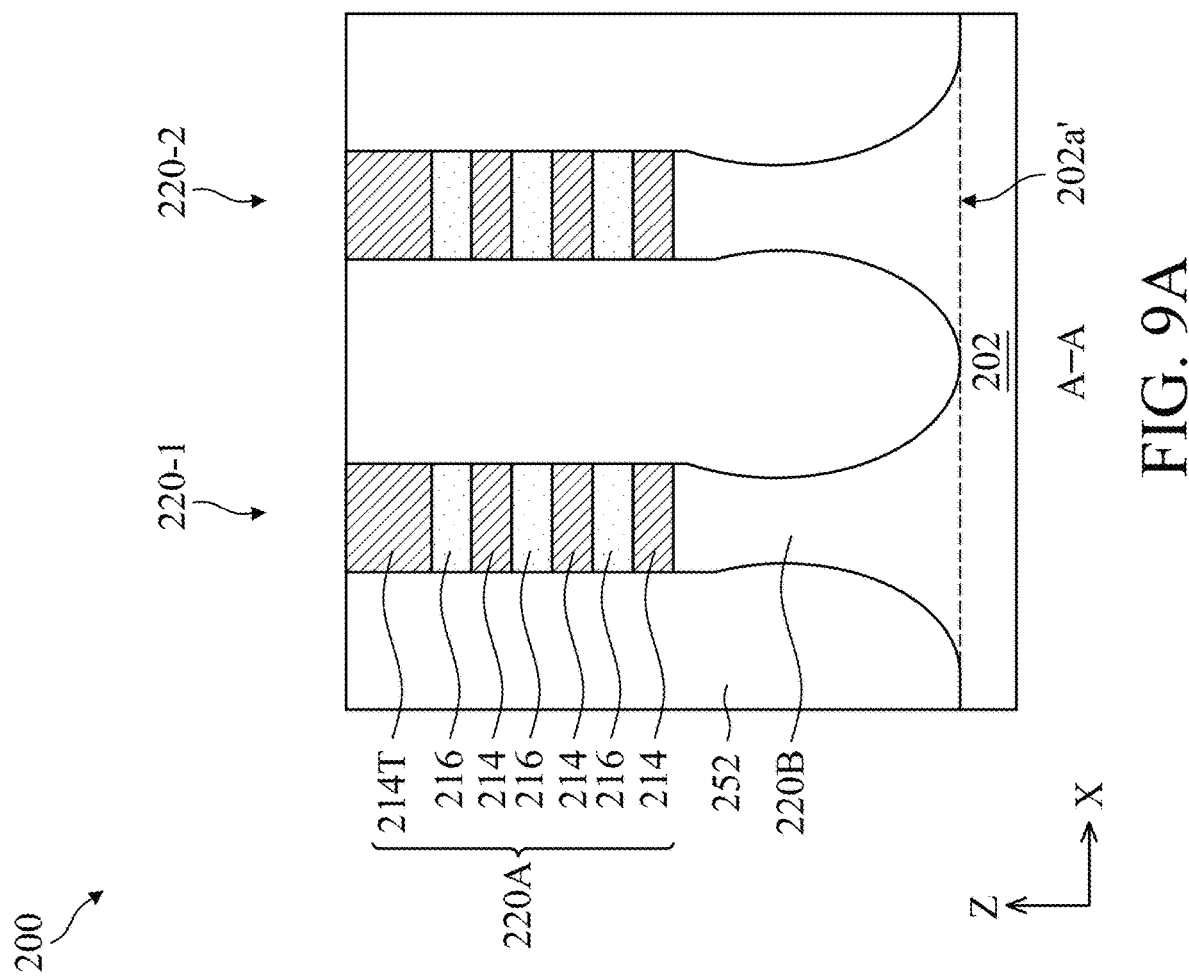
Figure 10A:
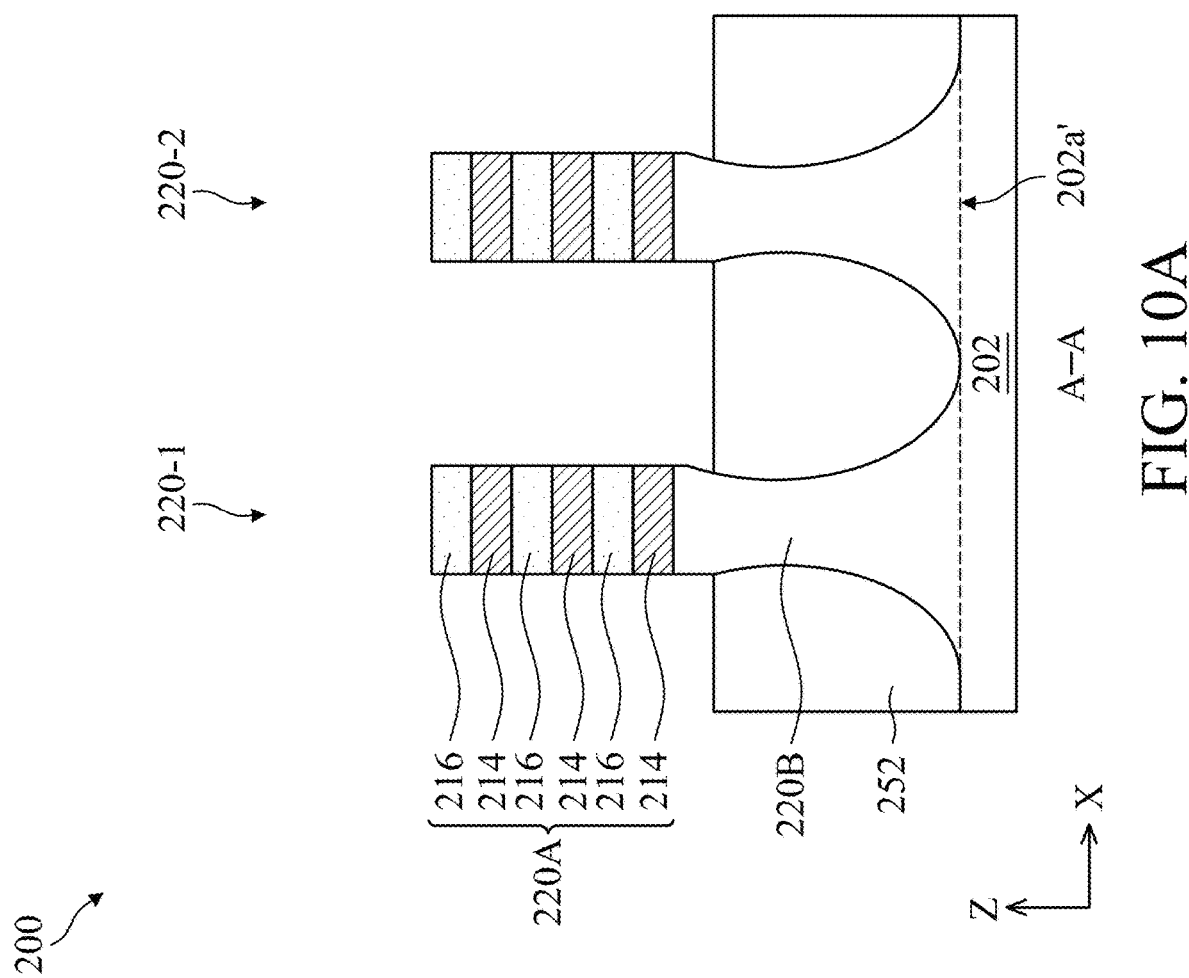
Figure 11A:
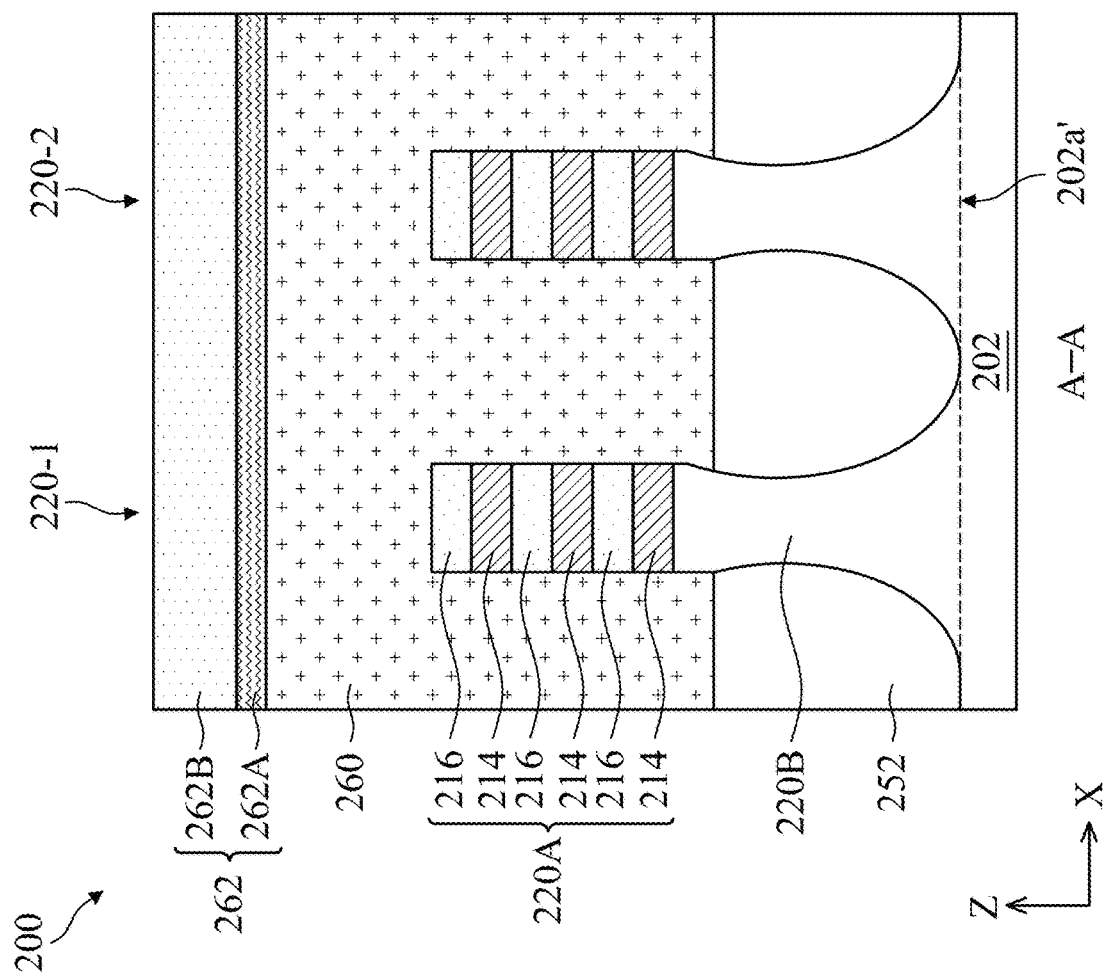
Figures 11B, 11C:
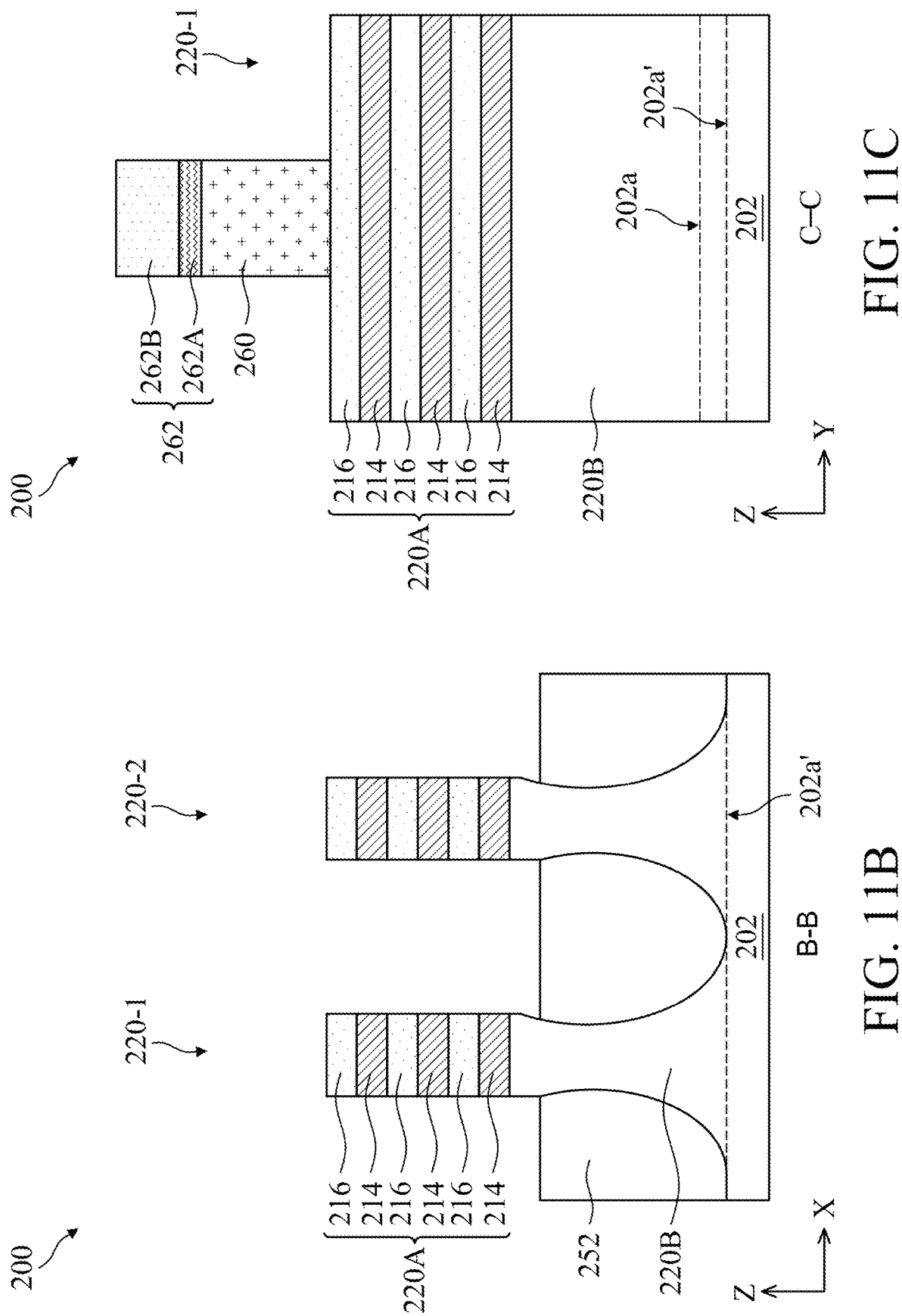
Figure 12A:
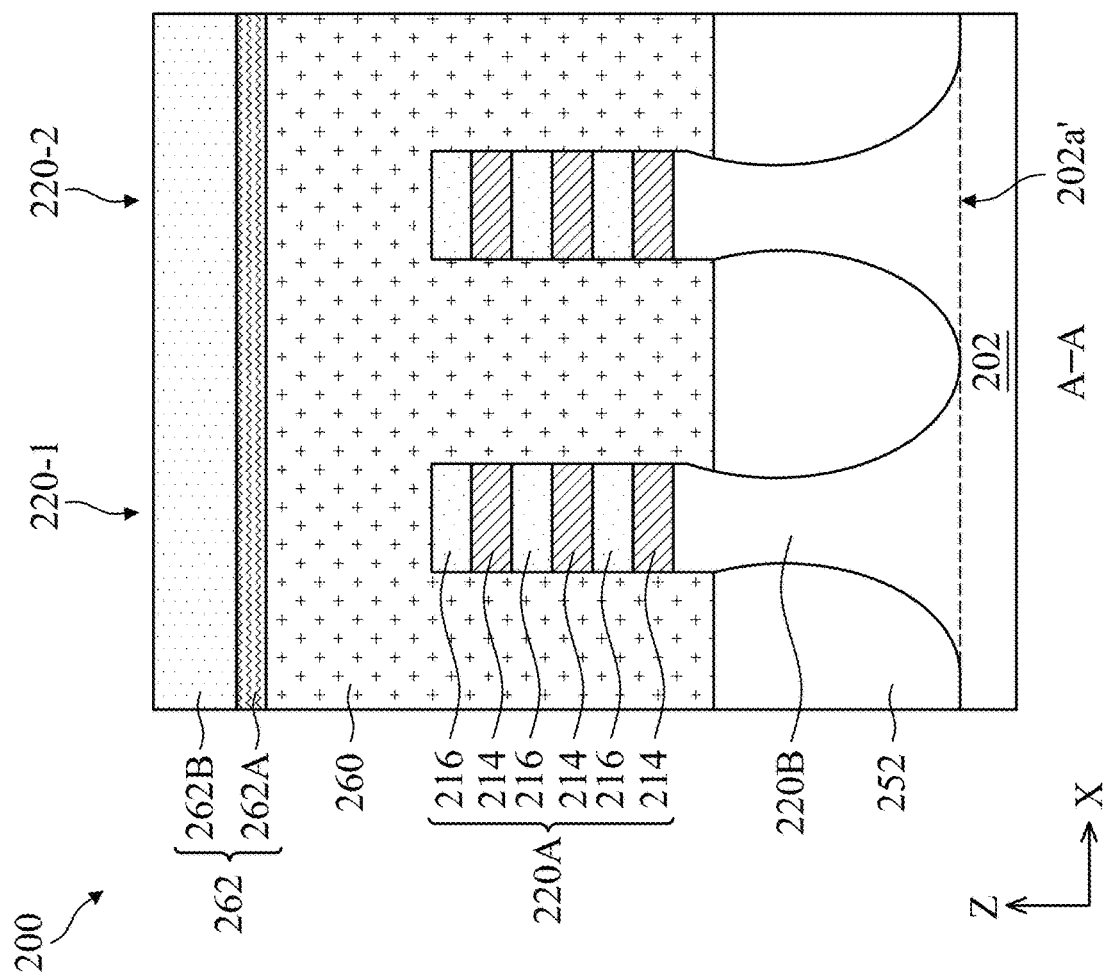
Figure 13A:
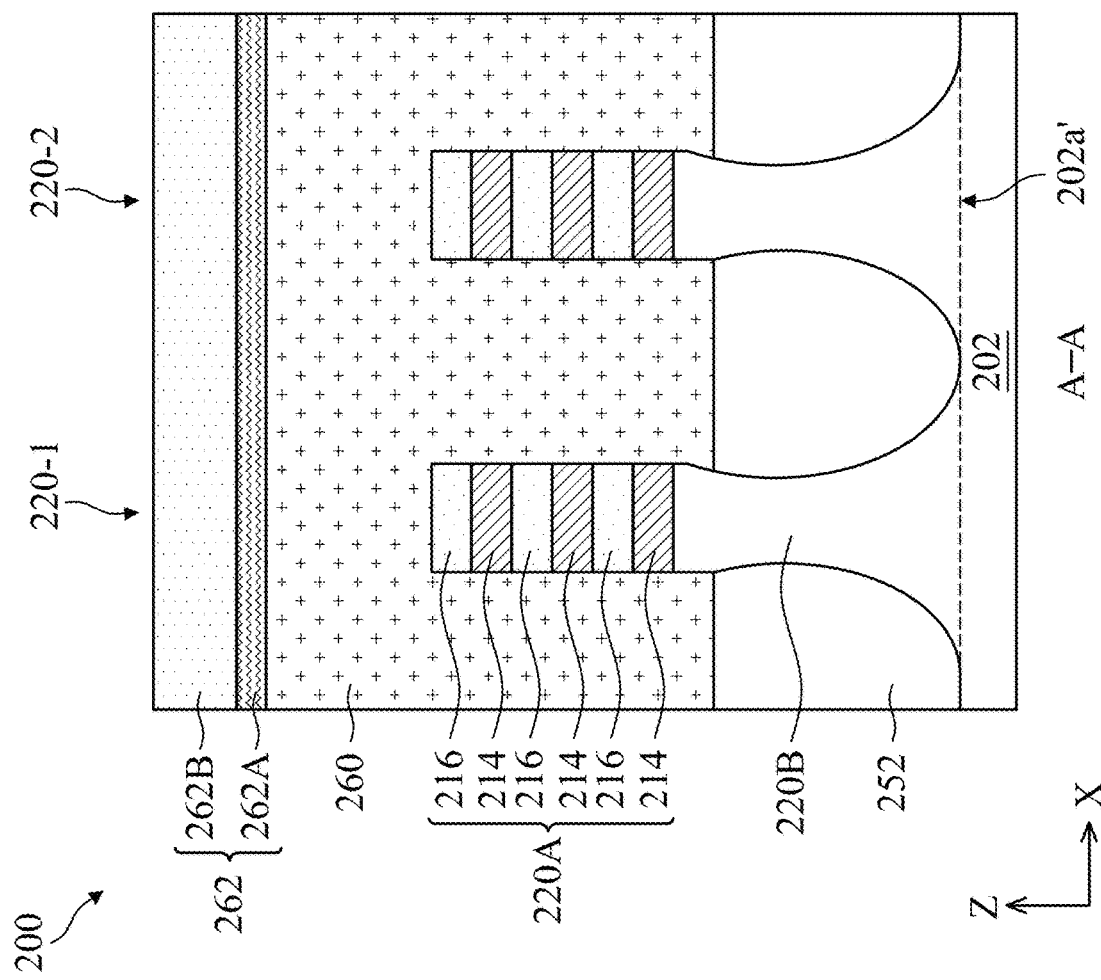
Figure 14A:
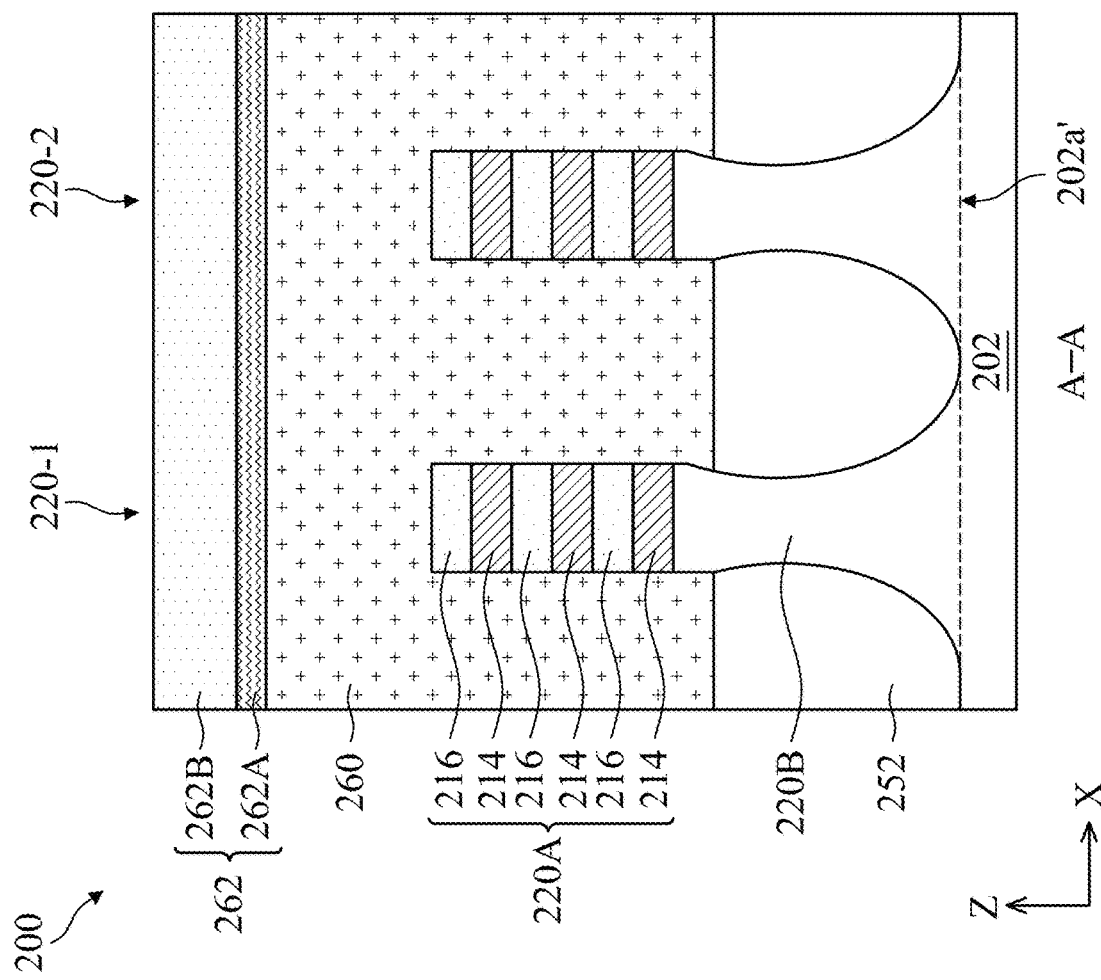
Figure 14C:
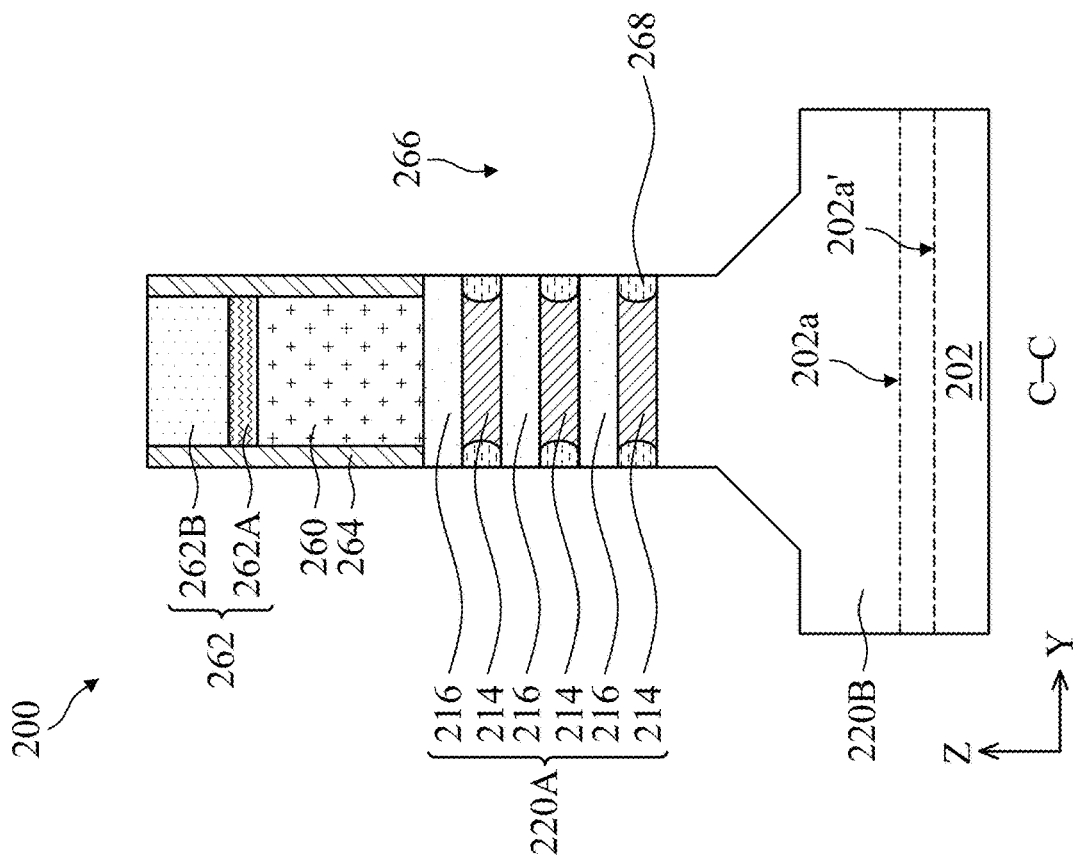
Figure 14B:
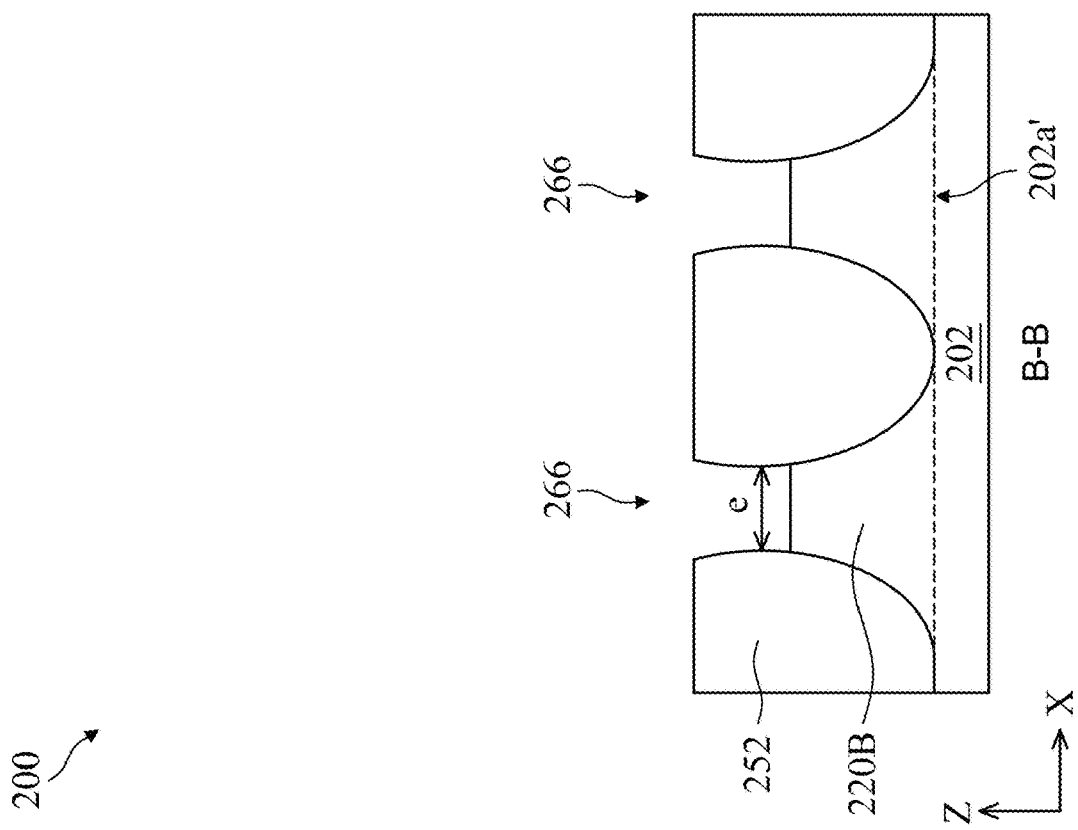
Figure 15A:
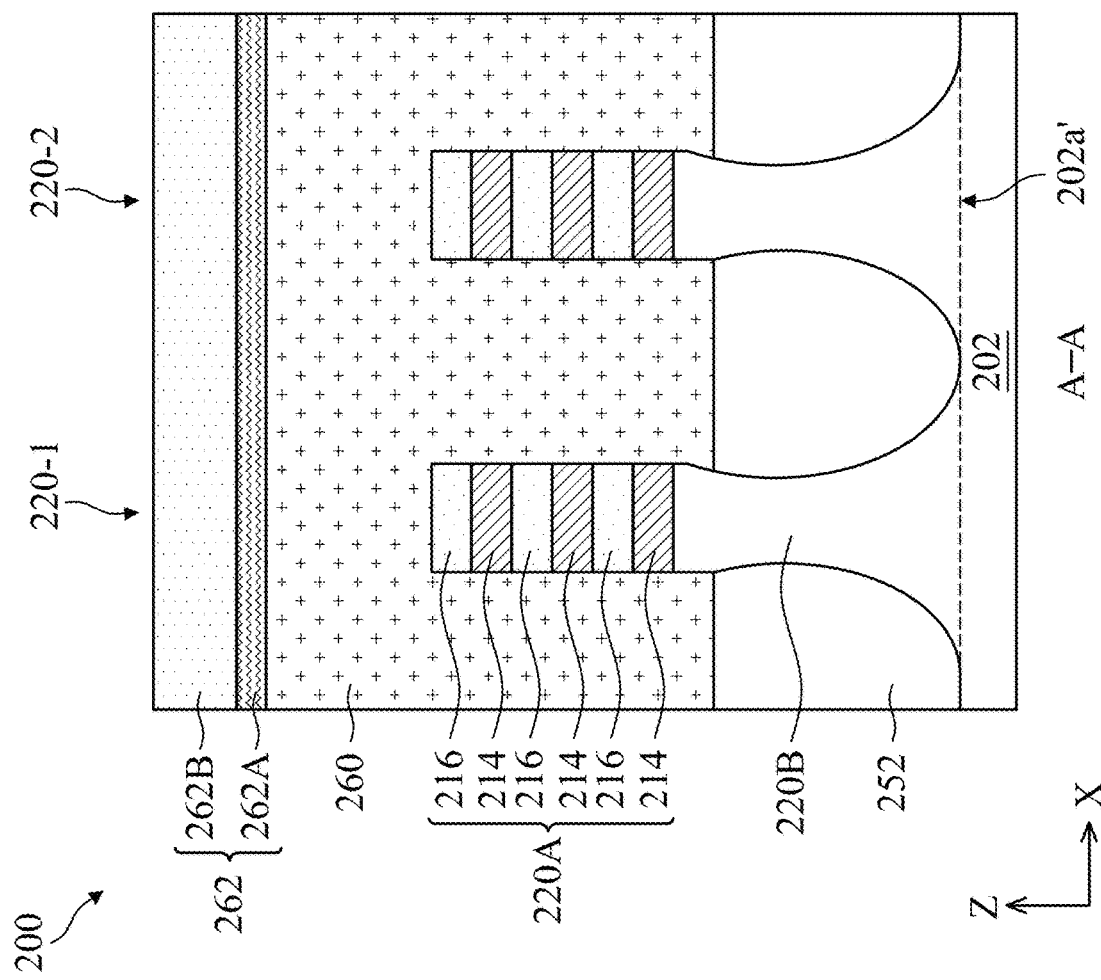
Figure 15C:
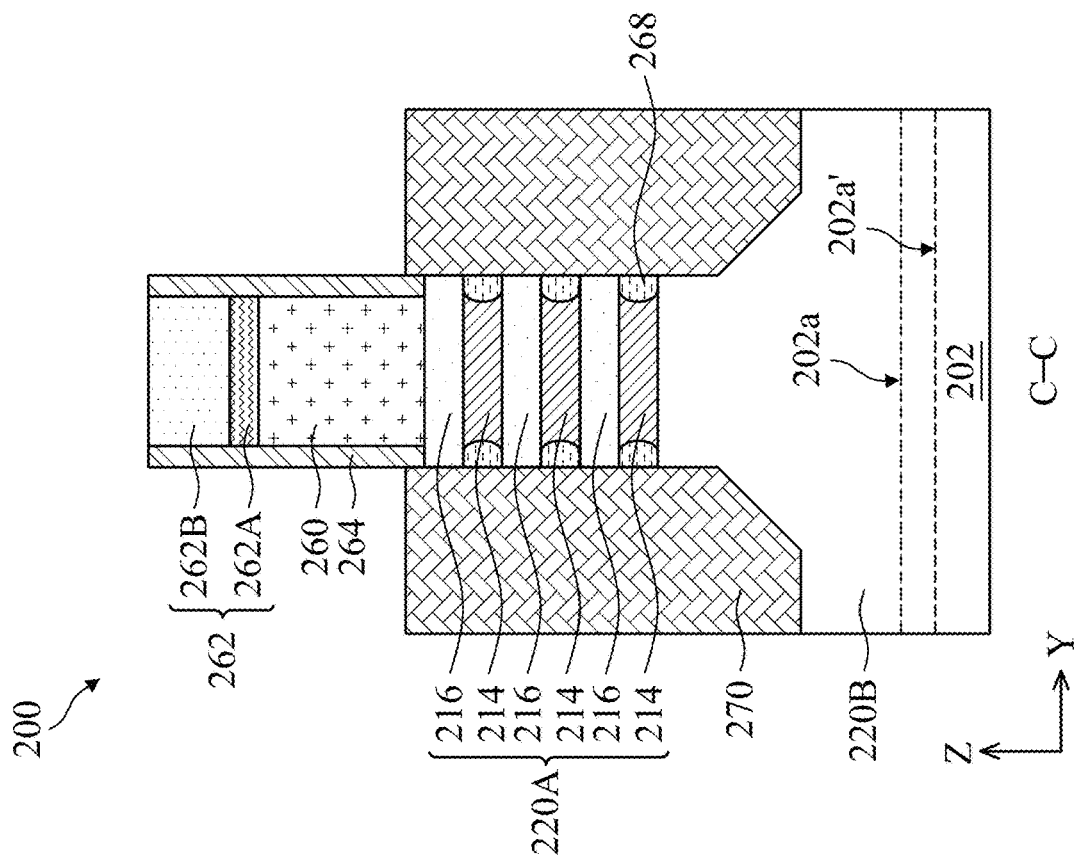
Figure 15B:
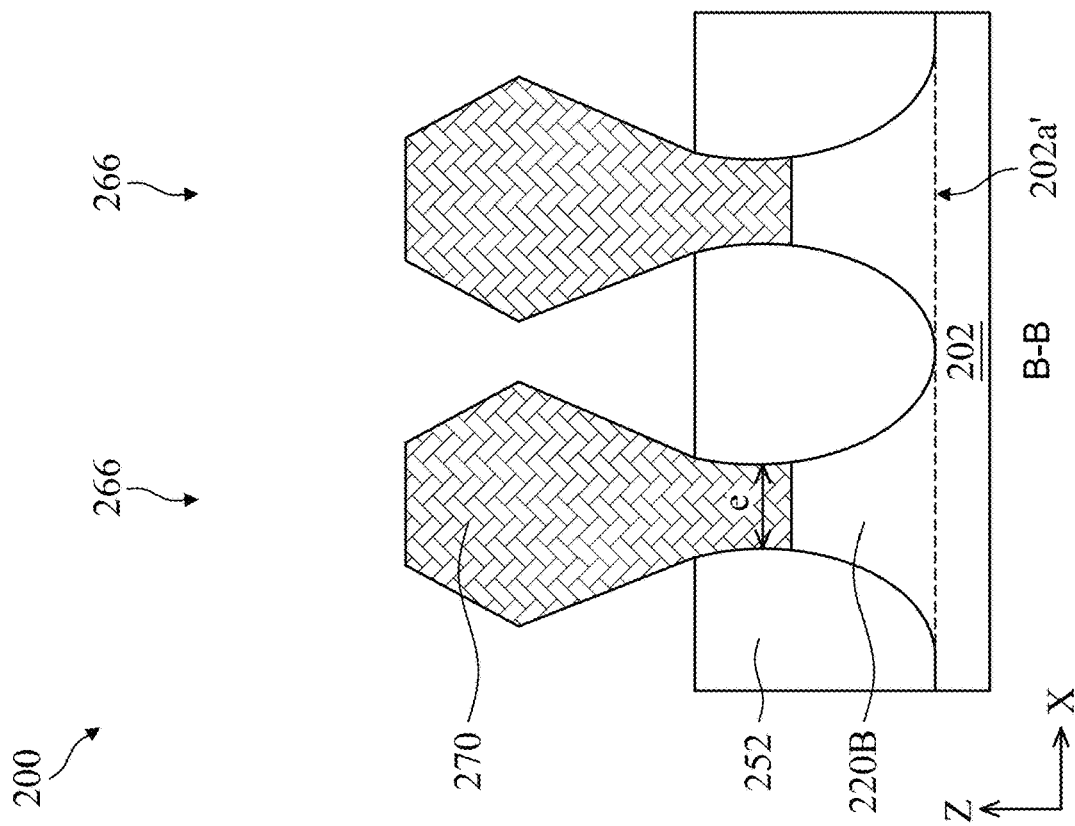
Figure 16A:
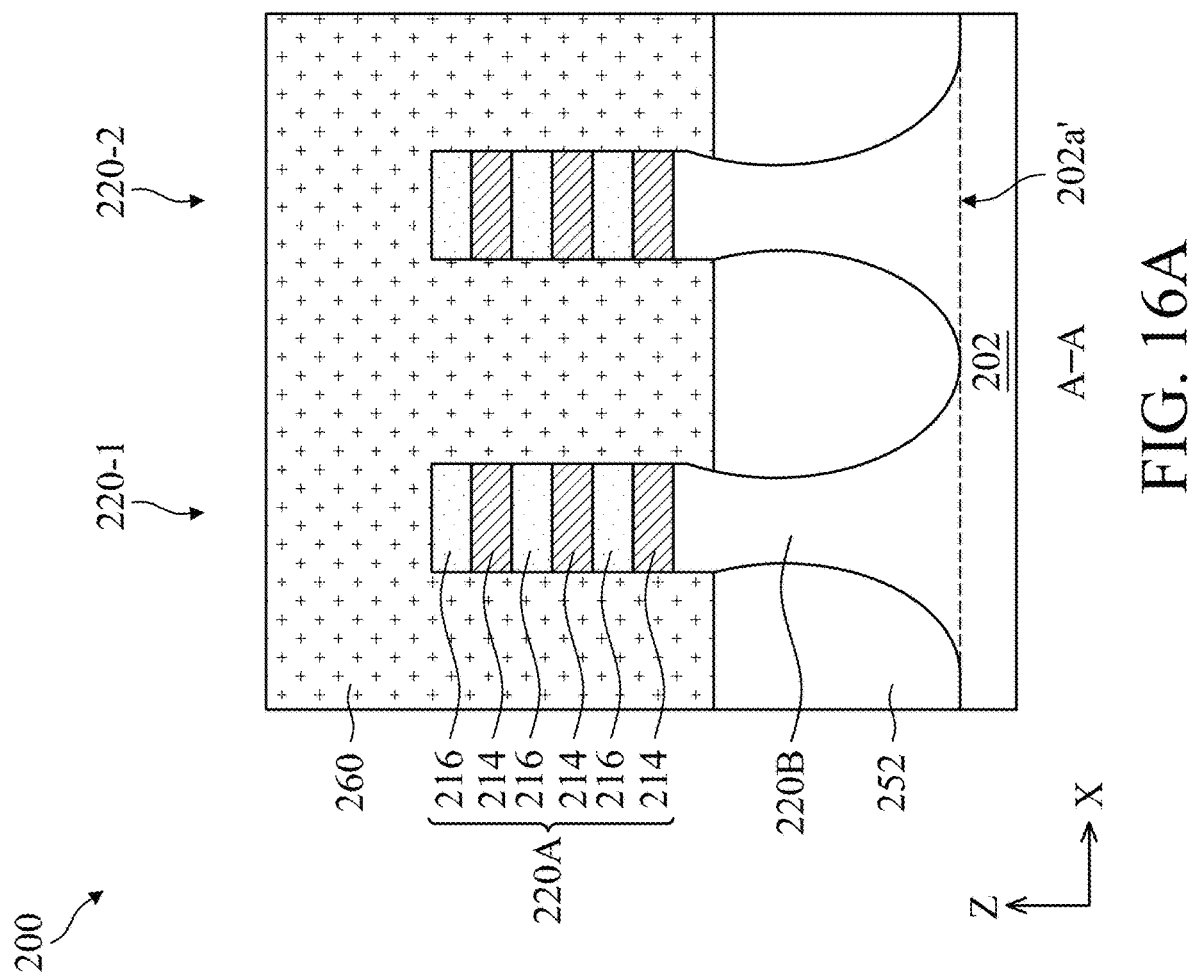
Figure 16C:
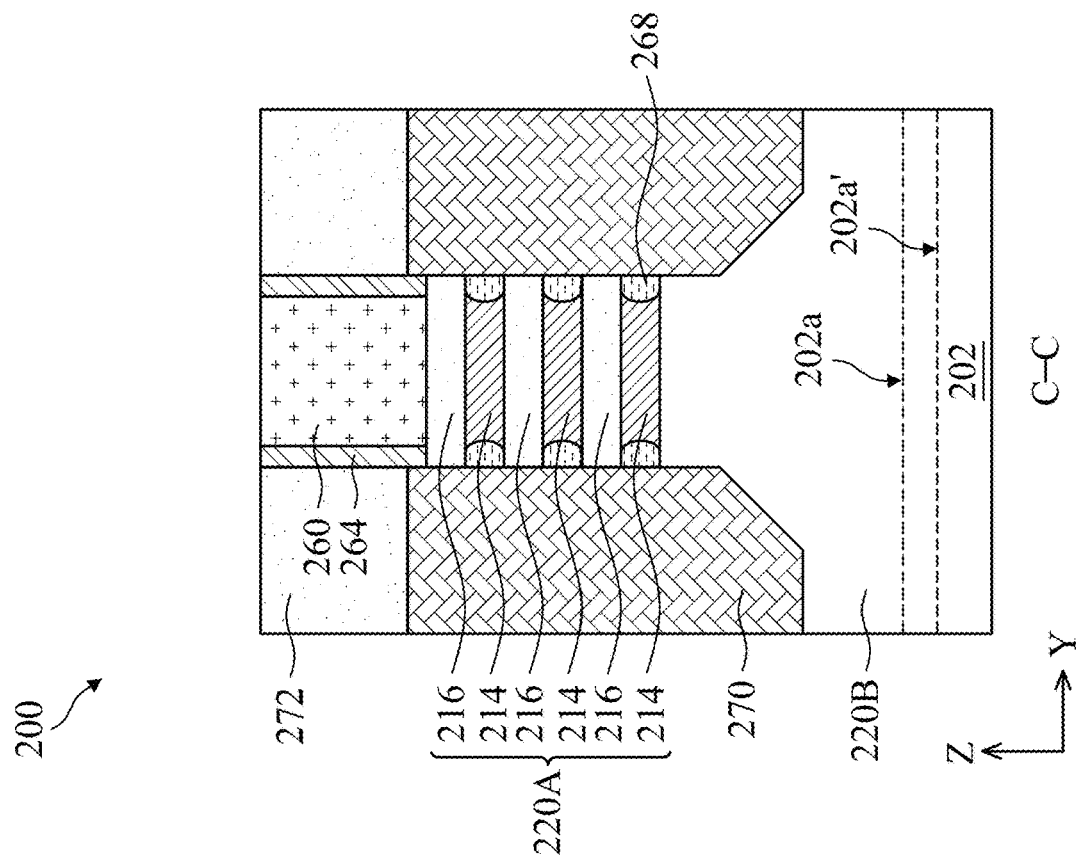
Figure 16B:
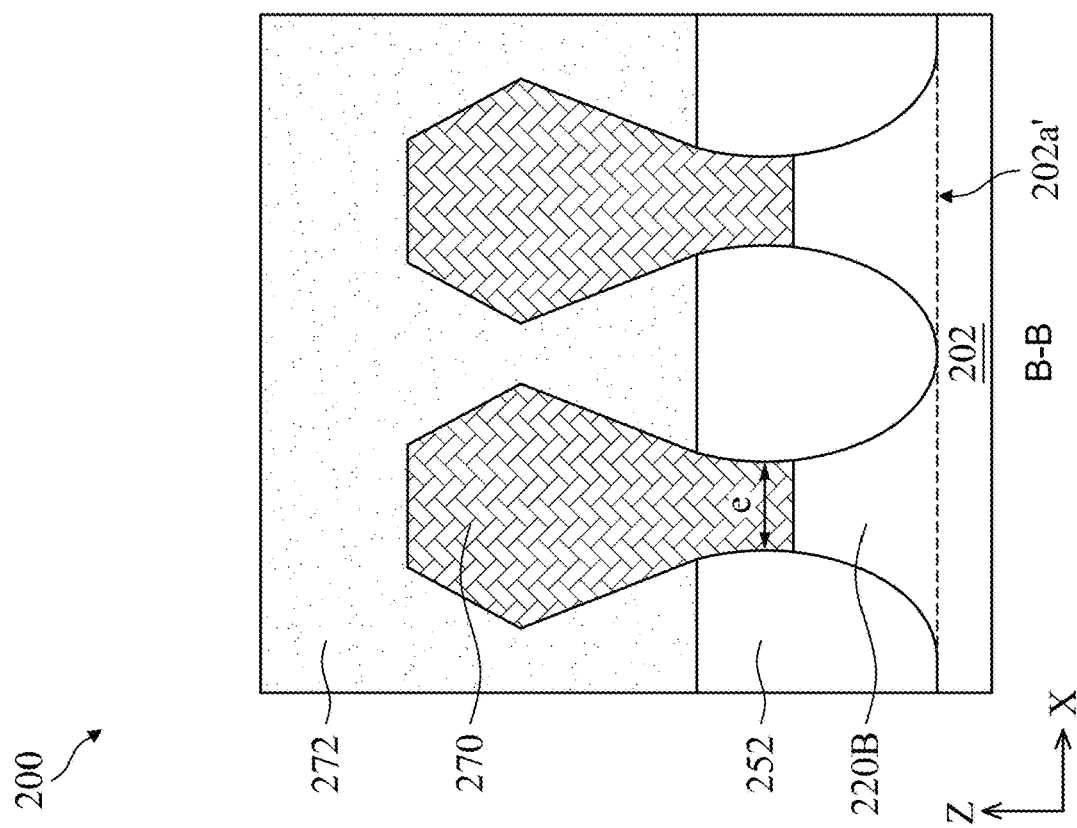
Figure 17A:
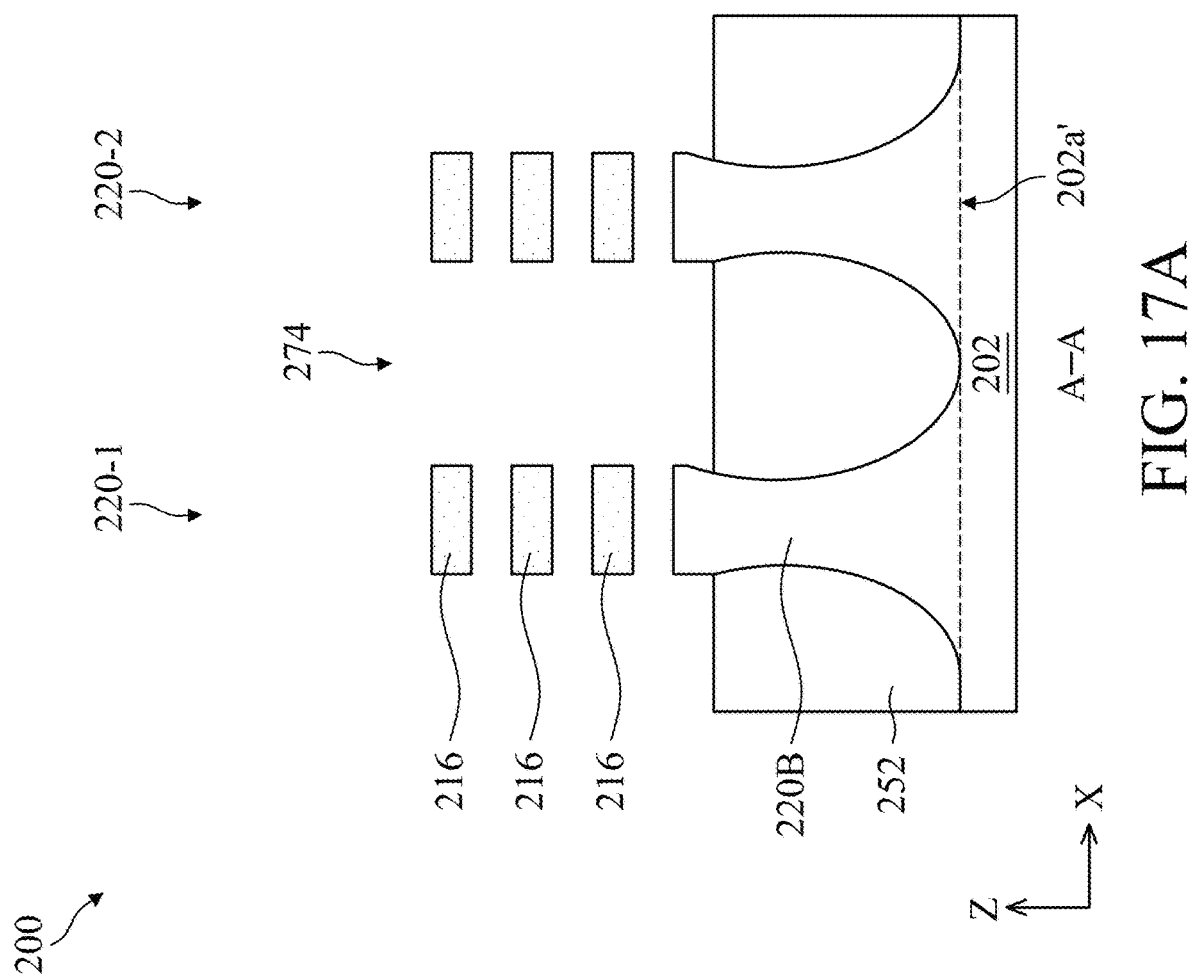
Figure 17C:
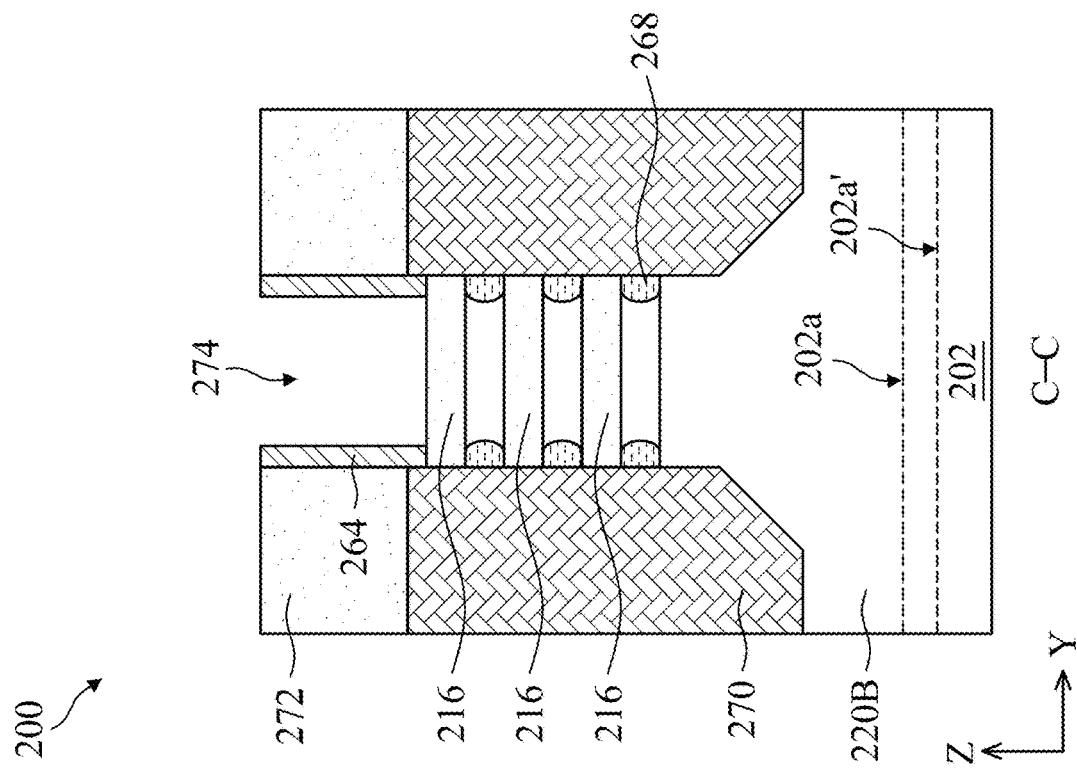
Figure 17B:
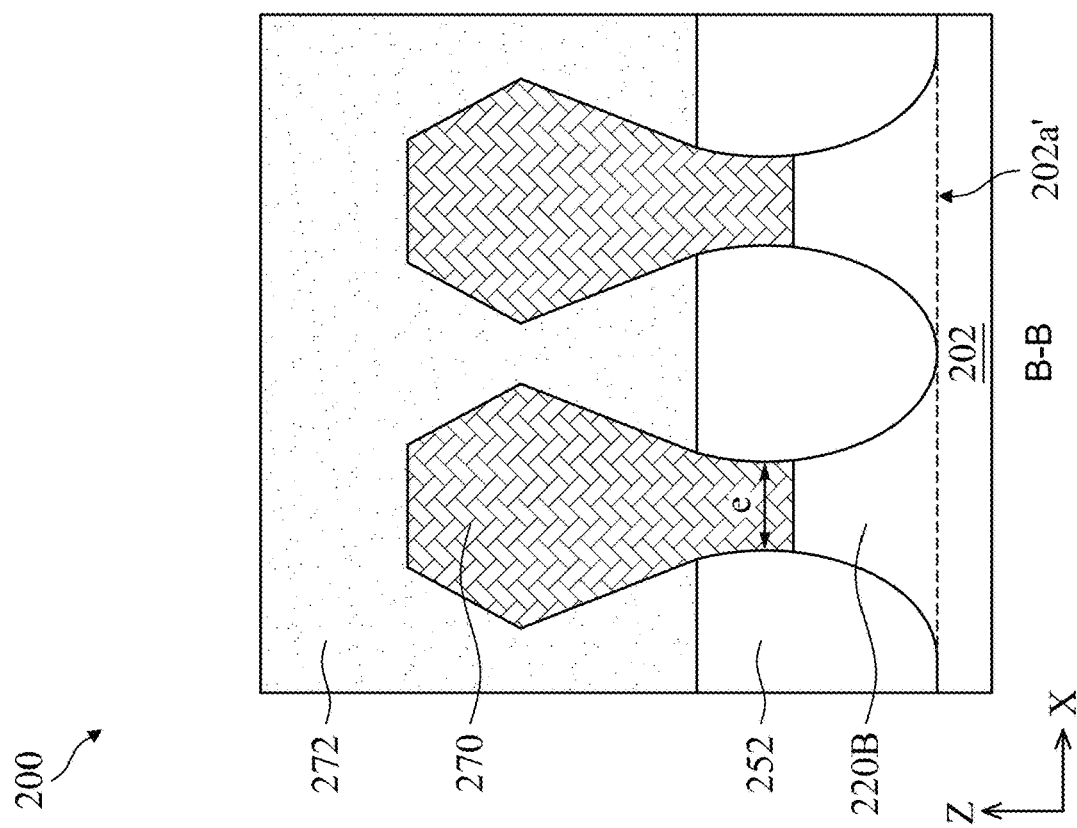

The various aspects of the present disclosure will now be described in more detail with reference to the figures. FIG. 1 illustrates a flowchart of a method 100 for forming a semiconductor device. The method 100 is merely an example and is not intended to limit the present disclosure to what is explicitly illustrated in the method. Additional steps may be provided before, during and after the respective method, and some steps described can be replaced, eliminated, or moved around for additional embodiments of the respective method. Not all steps are described herein in detail for reasons of simplicity. The method 100 is described below in conjunction with FIGS. 2-18C, which illustrate diagrammatic perspective views and fragmentary cross-sectional views of a workpiece 200 at different stages of fabrication according to embodiments of the method 100. Because a semiconductor device will be formed from the workpiece 200, the workpiece 200 may be referred to as a semiconductor device 200 or a device 200 as the context requires. FIGS. 2-4 are diagrammatic perspective views of the workpiece 200 at various stages of fabrication according to some embodiments. Among FIGS. 5A-18C, for better illustration of various aspects of the present disclosure, each of the figures ending with the capital letter A illustrates a fragmentary cross-sectional view in a channel region (i.e., as illustrated in FIG. 4, a cut along A-A line in a channel region along a lengthwise direction of gate structures and perpendicular to a lengthwise direction of channel layers) of the to-be-formed transistors. Each of the figures ending with the capital letter B illustrates a fragmentary cross-sectional view of a source/drain region (i.e., as illustrated in FIG. 4, a cut along B-B line in a source/drain region that is perpendicular to the lengthwise direction of channel layers) of the to-be-formed transistors. Each of the figures ending with the capital letter C illustrates a fragmentary cross-sectional view along a first fin (i.e., as illustrated in FIG. 4, a cut along C-C line along a first fin). Throughout FIGS. 2-18C, the X direction, the Y direction, and the Z direction are perpendicular to one another and are used consistently. Additionally, throughout the present disclosure, like reference numerals are used to denote like features.

Referring to FIGS. 1 and 2, the method 100 includes a block 102 where a workpiece 200 is received. As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including p-type FETs, n-type FETs, etc., which may be interconnected. The workpiece 200 includes a substrate 202. In some embodiments, the substrate 202 may be a semiconductor substrate such as a silicon (Si) substrate. In some embodiments, the substrate 202 includes a single crystalline semiconductor layer on at least its surface portion. The substrate 202 may comprise a single crystalline semiconductor material such as, but not limited to Si, Ge, SiGe, GaAs, InSb, GaP, GaSb, InAlAs, InGaAs, GaSbP, GaAsSb and InP. Alternatively, the substrate 202 may include a compound semiconductor and/or an alloy semiconductor. The substrate 202 may include various layers, including conductive or insulating layers formed on a semiconductor substrate.

Referring to FIGS. 1 and 3, the method 100 includes a block 104 where one or more epitaxial layers are formed over the substrate 202. In some embodiments, an epitaxial stack 212 is formed over the substrate 202. The epitaxial stack 212 includes epitaxial layers 214 of a first composition interposed by epitaxial layers 216 of a second composition, and a top epitaxial layer 214T of the first composition over the top epitaxial layer 216. The first and second composition can be different. In an embodiment, the epitaxial layers 214 are silicon germanium (SiGe) and the epitaxial layers 216 are silicon (Si). However, other embodiments are possible including those that provide for a first composition and a second composition having different oxidation rates and/or etch selectivity. It is noted that three (3) layers of each of the epitaxial layers 214 and 216 are illustrated in FIG. 3, which is for illustrative purposes only and not intended to be limiting beyond what is specifically recited in the claims. It can be appreciated that any number of epitaxial layers can be formed in the epitaxial stack 212; the number of epitaxial layers depending on the desired number of channel layers for forming transistors. In some embodiments, the number of epitaxial layers 216 is between 2 and 10.

In some embodiments, the epitaxial layer 214 has a thickness ranging from about 8 nm to about 12 nm. The epitaxial layers 214 may be substantially uniform in thickness. In some embodiments, the epitaxial layer 216 has a thickness ranging from about 8 nm to about 10 nm. In some embodiments, the epitaxial layers 216 may be substantially uniform in thickness. As described in more detail below, the epitaxial layers 216 may serve as channel layers (or channel members) for subsequently-formed GAA transistors and its thickness is chosen based on device performance considerations. The epitaxial layers 216 may also be referred to as the channel layers 216. The epitaxial layers 214 may serve to reserve a spacing (or referred to as a gap) between adjacent channel layers and its thickness is chosen based on device performance considerations. The epitaxial layers 214 would be subsequently removed and may also be referred to as the sacrificial layers 214. Like the epitaxial layers 214, the top epitaxial layer 214T may be formed of silicon germanium (SiGe). The top epitaxial layer 214T may be thicker than the epitaxial layers 214 and function to protect the epitaxial stack 212 from damages during fabrication processes. In some instances, a thickness of the top epitaxial layer 214T may be between about 20 nm and about 40 nm.

By way of example, epitaxial growth of the epitaxial stack 212 may be performed by a molecular beam epitaxy (MBE) process, a metalorganic chemical vapor deposition (MOCVD) process, and/or other suitable epitaxial growth processes. In some embodiments, the epitaxially grown layers, such as the epitaxial layers 216, include the same material as the substrate 202, such as silicon (Si). In some embodiments, compositions of the top epitaxial layer 214T and the epitaxial layers 214 are substantially the same. In some embodiments, the epitaxial layers 214 and 216 include a different material than the substrate 202. As stated above, in at least some examples, the epitaxial layer 214 includes an epitaxially grown $Si_{1-x}Ge_x$ layer (e.g., x is about 25-55%) and the epitaxial layer 216 includes an epitaxially grown Si layer. Alternatively, in some embodiments, either of the epitaxial layers 214 and 216 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 214 and 216 may be chosen based on providing differing oxidation and etch selectivity properties. In various embodiments, the epitaxial layers 214 and 216 are substantially dopant-free (i.e., having an extrinsic dopant concentration from about 0 $cm^{-3}$ to about $1 \times 10^{17}$ $cm^{-3}$), where for example, no intentional doping is performed during the epitaxial growth process.

Further, a mask layer 218 is formed over the epitaxial stack 212. In some embodiments, the mask layer 218 includes a first mask layer 218A and a second mask layer 218B. The first mask layer 218A is a pad oxide layer made of silicon oxide, which can be formed by a thermal oxidation process. The second mask layer 218B is made of silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process.

Referring to FIGS. 1, 4, and 5A-5C, the method 100 includes a block 106 where the epitaxial stack 212 are patterned to form a first semiconductor fin 220-1 and a second semiconductor fin 220-2 (collectively referred to as fins 220), as shown in FIG. 4 and FIGS. 5A-5C. In some embodiments, the first semiconductor fin 220-1 is in an NFET region and will be formed as part of a n-type FET, and the second semiconductor fin 220-2 is in a PFET region and will be formed as part of a p-type FET. In some embodiments, the first semiconductor fin 220-1 and the second semiconductor fin 220-2 are in the same region and will be formed as parts of FETs of the same conductivity type. In various embodiments, each of the fins 220 includes an upper portion 220A (also termed as epitaxial portion 220A) of the interleaved epitaxial layers 214/216 and the top epitaxial layer 214T, and a base portion 220B that is formed by patterning a top portion of the substrate 202. The base portion 220B still has a fin-shape protruding from the substrate 202 and is also termed as the fin-shape base 220B. Also due to its flat-topped elevation, the base portion 220B is also termed as the mesa 220B.

The mask layer 218 is patterned into a mask pattern by using patterning operations including photo-lithography and etching. In some embodiments, operations at the block 106 patterns the epitaxial stack 212 using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the epitaxial stack 212 in an etching process, such as a dry etch (e.g., reactive ion etching), a wet etch, and/or other suitable process, through openings defined in the patterned mask layer 218. The stacked epitaxial layers 214 and 216 are thereby patterned into fins 220 with trenches 224 between adjacent fins.

In some embodiments, operations at the block 106 includes a first etching process that patterns the epitaxial stack 212 and a second etching process that patterns the top portion of the substrate 202. For example, the first etching process may include a reactive ion etching (RIE) under a source power of about 500 W to 700 W, a bias power of about 50 W to 70 W, and a pressure of about 3 mTorr to 10 mTorr, using $CH_2F_2$, $SF_6$, $N_2$, and He as etching gases. After the first etching process, the sidewalls of the epitaxial portion 220A are substantially perpendicular to a top surface (major surface) 202a of the substrate 202. The first etching process may slightly over etch a top portion of the substrate 202, such that a top portion of the sidewalls of the mesa 220B are also substantially perpendicular to the top surface 202a of the substrate 202. The second etching process further etches the top portion of the substrate 202 in forming the mesa 220B. For example, the second etching process may include a reactive ion etching (RIE) under a source power of about 1100 W to about 1200 W, a bias power of about 200 W to about 230 W, and a pressure of about 10 mTorr to about 20 mTorr, using HBr, $SF_6$, and He as etching gases. After the second etching process, the sidewalls of the mesa 220B have a tapered profile. In some embodiments, the tapered sidewalls of the mesa 220B and the top surface 202a of the substrate 202 form an angle θ in a range from about 65 degrees to about 85 degrees. As will be discussed in further details below, the tapered sidewalls of the mesa 220B will be adjusted to have a concave profile in order to increase resistance of current path through the mesa 220B into the substrate 202, thereby achieving leakage current suppression.

At the conclusion of the block 106, each of the fins 220 protrudes upwardly in the Z-direction from the substrate 202 and extends lengthwise in the Y-direction. In FIG. 4, two (2) fins 220 are spaced apart along the X-direction. But the number of the fins is not limited to two, and may be as small as one or more than two. Notably, although in the illustrate embodiment, the two fins 220 are depicted as adjacent to each other, it is for illustrative purposes only. In various embodiments, the fins 220 may be adjacent to each other or separated from one another with other fins disposed therebetween. In some embodiments, a fin height measured from a top surface of the topmost epitaxial layer 216 to the top surface 202a of the substrate 202, denoted as h (FIG. 5A), is in a range of about 100 nm to about 220 nm; a top width of the mesa 220B, denoted as a (FIG. 5A), which is substantially the same as the width of the epitaxial portion 220A, is in a range of about 10 nm to about 100 nm; a bottom width of the mesa 220B, denoted as b (FIG. 5A), is in a range of about 10 nm to about 150 nm; and a ratio of b/a is in a range of about 1 to about 1.5. If the ratio of b/a is lower than 1, then the mechanical strength of the fin 220 becomes weak; if the ratio of b/a is larger than 1.5, fin-to-fin separation has to be enlarged to accommodate, which in turn reduces device density.

Referring to FIGS. 1 and 6A-6C, the method 100 includes a block 108 where a polymeric material (or polymeric layer) 250 is deposited at least on the top and sidewall surfaces of the epitaxial portion 220A. In an embodiment, the polymeric material 250 may comprise $C_wH_xF_yO_z$ polymer where w, x, y, and z indicate the atomic percentage of each chemical element. For example, the polymeric material 250 may be deposited under a process condition having a gas mixture of $CH_3F$ and oxygen at a flow rate of about 100 sccm to about 350 sccm, a source power of about 1000 W to about 1500 W, and a pressure of about 5 mTorr to about 40 mTorr. It is noted that the polymeric material 250 is deposited unevenly across the surfaces of the fins 220 due to the uneven topography of the structures. Particularly, the top surface of the fin 220 is higher than either the vertical sidewalls of the epitaxial portion 220A or the tapered sidewalls of the mesa 220B. As a result, a thickness of the polymeric material 250 gradually decreases from the top surface of the fin 220 to the sidewalls of the epitaxial portion 220A. In some embodiments, a thickness of the polymeric material 250 on the top surface of the fin 220, denoted as c (FIG. 6A) is in a range of about 5 nm to about 30 nm; a thickness of the polymeric material 250 on sidewalls of the fin 220 measured from a midpoint of the epitaxial portion 220A, denoted as d (FIG. 6A) is in a range of about 3 nm to about 25 nm. The deposition is controlled in time mode such that the polymeric material 250 extends downward barely below the bottom surface of the bottommost epitaxial layer 214 and stops before reaching the tapered sidewalls of the mesa 220B. The lowest points of the polymeric material 250 may be asymmetric on the opposing sidewalls of the fin 220. In the illustrated embodiment, the polymeric material 250 substantially fully covers the top vertical portion of one sidewall of the mesa 220B, but partially covers the top vertical portion of another sidewall of the mesa 220B. Covering the sidewall surfaces of the epitaxial portion 220A under the polymeric material 250 provides the benefits of protecting the epitaxial portion 220A from a subsequent etching process (to be described) that modifies the tapered profile of the sidewalls of the mesa 220B.

In an alternative embodiment, the first etching process at the block 106 that patterns the epitaxial stack 212 includes forming the polymeric material 250 as a byproduct. In an embodiment, the first etching process is anisotropic and may be performed with a gas mixture of $CH_3F$ and oxygen at a flow rate of 100 sccm to 300 sccm, a source power of about 1000 W to about 1500 W, and a pressure of about 5 mTorr to about 40 mTorr. Other gases may be alternatively or additionally deployed by the etching process. Particularly, the etching process produces one or more polymeric byproducts 250 such as $C_wH_xF_yO_z$ polymer where w, x, y, and z indicate the atomic percentage of each chemical element. The polymeric byproducts 250 are produced simultaneously during the etching process and are deposited over the various surfaces of the fin 220. Subsequently, the second etching process at the block 106 patterns the top portion of the substrate 202 into the mesa 220B without further creating polymeric byproducts 250. In this alternative embodiment, the polymeric material 250 is formed on surfaces of the epitaxial portion 220A prior to the forming of the mesa 220B from patterning the top portion of the substrate 202. The method 100 may thus skip the block 108 and proceed to the block 110 at the conclusion of the block 106.

Referring to FIGS. 1 and 7A-7C, the method 100 includes a block 110 where the sidewall profile of the mesa 220B is modified in an etching process. The etching process is a selectively etching that substantially remains the polymeric material 250 intact. The polymeric material 250 protects the epitaxial portion 220A wrapped underneath from etching loss. In some embodiments, the etching process is a dry etching process with an etchant having the atoms of chlorine, fluorine, bromine, oxygen, hydrogen, carbon, or a combination thereof. For example, the etchant may have a gas mixture of $Cl_2$, $O_2$, a carbon-and-fluorine containing gas, a bromine-and-fluorine containing gas, and a carbon-hydrogen-and-fluorine containing gas. The etching process may be performed inside a plasma etch reactor with other parameters such as an etchant flow rate between about 500 sccm and about 1000 sccm, a gas pressure between about 60 mtorr and about 90 mtorr, an RF power between about 1000 W and about 2000 W, and a bias voltage between about 200 V and about 500 V. The parameters in the etching process are tuned such that the etchant exhibits certain lateral etching rate. In some embodiments, the etching process is a wet etching process with a wet etchant selected from, but not limited to, ammonium hydroxide ($NH_4OH$), tetramethylammonium hydroxide (TMAH), ethylenediamine pyrocatechol (EDP), or potassium hydroxide (KOH) solution. The etching process further recesses the substrate 202 in the Z-direction, such that the top surface 202a is lowered for an extra distance Δh of about 5 nm to about 30 nm. The recessed top surface is denoted as the top surface 202a'. The fin height measured from a top surface of the topmost epitaxial layer 216 to the top surface 202a' of the substrate 202, denoted as h' (FIG. 7A), is expanded to a range of about 150 nm to about 250 nm. The etching process also laterally removes portions of the mesa 220B from its sidewalls, creating a concave profile. That is, each sidewall of the mesa 220B now has a curvature shape bending towards a center of the mesa 220B. The curvature shape starts from the lowest point of the polymeric material 250 on each sidewall. The bottom of the curvature shape forms an angle θ' with the top surface 202a' in a range of about 30 degrees to about 50 degrees. The narrowest width of the mesa 220B, denoted as e (FIG. 7A), is in a range of about 5 nm to about 100 nm. In some embodiments, the narrowest width occurs at a position above half of the height of the mesa 220B, such as from about 0.5 to about 0.8 of the height of the mesa 220B measured from the top surface 202a' of the substrate 202. In some embodiments, a ratio of e/a is in a range of about 0.5 to about 0.9. If the ratio of e/a is lower than 0.5, then the mechanical strength of the fin 220 becomes weak; if the ratio of e/a is larger than 0.9, the leakage current through the mesa 220B may still be strong, which in turn deteriorates device performance. The lateral etching reshapes the sidewalls of the mesa 220B, reducing its cross-sectional area. The reduced cross-sectional area of the mesa 220B increases resistance of the current path through the mesa 220B into the substrate 202, thereby suppressing the leakage current. As discussed above, due to the unlevel lowest points of the polymeric material 250 on the opposing sidewalls of the mesa 220B, the top vertical sidewalls of the mesa 220B may become asymmetric, with one vertical sidewall extends in the Z-direction longer than another. In other words, a topmost point of the curvature shape on one sidewall may start at a position lower than on the other side.

Referring to FIGS. 1 and 8A-8C, the method 100 includes a block 112 where the polymeric material 250 is removed in a cleaning process. In one embodiment, the polymer cleaning is accomplished by flowing $CF_4$ gas at a rate of between about 60 sccm and about 100 sccm under a pressure maintained at between about 4 mTorr and about 15 mTorr. The source power is controlled at between about 300 W and about 500 W, while a bias power is controlled at between about 30 W and about 50 W for a duration between about 5 seconds and 15 seconds. After the polymeric material 250 is removed, the epitaxial portion 220A is exposed again.

Referring to FIGS. 1 and 9A-9C, the method 100 includes a block 114 where the trenches 224 between adjacent fins 220 are filled with a dielectric material to form an isolation feature 252. The isolation feature 252 may include one or more dielectric layers. Suitable dielectric materials for the isolation feature 252 may include silicon oxides, silicon nitrides, silicon carbides, fluorosilicate glass (FSG), low-K dielectric materials, and/or other suitable dielectric materials. The dielectric material may be deposited by any suitable technique including thermal growth, CVD, HDP-CVD, PVD, ALD, and/or spin-on techniques. Then, a planarization operation, such as a chemical mechanical polishing (CMP) method, is performed such that the upper surface of the top epitaxial layer 214T is exposed from the isolation feature 252.

Referring to FIGS. 1 and 10A-10C, the method 100 includes a block 116 where the isolation feature 252 is recessed to form a shallow trench isolation (STI) features (also denoted as an STI feature 252). Any suitable etching technique may be used to recess the isolation feature 252 including dry etching, wet etching, RIE, and/or other etching methods, and in an exemplary embodiment, an anisotropic dry etching is used to selectively remove the dielectric material of the isolation feature 252 without etching the fins 220. In the illustrated embodiment, the mask layer 218 is removed by a CMP process performed prior to the recessing of the isolation feature 252. In some embodiments, the mask layer 218 is removed by an etchant used to recess the isolation feature 252. In the illustrated embodiment, the STI feature 252 is disposed on sidewalls of the mesa 220B and a top surface of the STI feature 252 is recessed below the top surface of the mesa 220B for about 1 nm to about 10 nm, such that the top vertical sidewall and a top portion of the curvature sidewalls of the mesa 220B are exposed. Alternatively, a top surface of the STI feature 252 may be coplanar with a bottom surface of the epitaxial portion 220A (or a top surface of the mesa 220B). Operations at the block 116 may also include an etching process that removes the top epitaxial layer 214T. In some embodiments, a liner layer (not shown) is blanket deposited over the fins 220 before depositing the isolation feature 252. In some embodiments, the liner layer is made of SiN or a silicon nitride-based material (e.g., SiON, SiCN or SiOCN). The liner layer is recessed together with the isolation feature 252 so that the epitaxial portion 220A (and a top portion of the mesa 220B in the illustrated embodiment) of the fins 220 are exposed.

Referring to FIGS. 1 and 11A-11C, the method 100 includes a block 118 where a dummy gate stack 260 is formed over the channel regions of the fins 220. In some embodiments, a gate replacement process (or gate-last process) is adopted where the dummy gate stack 260 serves as a placeholder for functional gate structures. Other processes and configuration are possible. In the illustrated embodiment, the dummy gate stack 260 includes a dummy dielectric layer and a dummy electrode disposed over the dummy dielectric layer. For patterning purposes, a gate top hard mask 262 is deposited over the dummy gate stack 260. The gate top hard mask 262 may be a multi-layer and include a silicon nitride mask layer 262A and a silicon oxide mask layer 262B over the silicon nitride mask layer 262A. The regions of the fins 220 underlying the dummy gate stack 260 may be referred to as channel regions. Each of the channel regions in either the fin 220-1 or the fin 220-2 is sandwiched between two source/drain regions for source/drain formation. In an example process, the dummy dielectric layer in the dummy gate stack 260 is blanket deposited over the workpiece 200 by CVD. A material layer for the dummy electrode is then blanket deposited over the dummy dielectric layer. The dummy dielectric layer and the material layer for the dummy electrode are then patterned using photolithography processes to form the dummy gate stack 260. In some embodiments, the dummy dielectric layer may include silicon oxide and the dummy electrode may include polycrystalline silicon (polysilicon).

Referring to FIGS. 1 and 12A-12C, the method 100 includes a block 120 where gate spacers 264 are formed on sidewall of the dummy gate stack 260. In some embodiments, the gate spacers 264 may have a thickness between about 2 nm and about 10 nm. In some embodiments, the gate spacers 264 may include a dielectric material such as silicon oxide, silicon nitride, silicon carbide, silicon oxynitride, SiCN, silicon oxycarbide, SiOCN, a low-K material, and/or combinations thereof. In some embodiments, the gate spacers 264 include multiple layers, such as a liner spacer layer and a main spacer layer. By way of example, the gate spacers 264 may be formed by conformally depositing a dielectric material over the device 200 using processes such as a CVD process, a subatmospheric CVD (SACVD) process, a flowable CVD process, an ALD process, a PVD process, or other suitable process. Following the conformal deposition of the dielectric material, portions of the dielectric material used to form the gate spacers 264 may be etched-back to expose portions of the fins 220 not covered by the dummy gate stack 260 (e.g., in source/drain regions as in FIG. 12B). In some instances, the etch-back process removes portions of dielectric material used to form the gate spacers 264 along a top surface of the dummy gate stack 260, thereby exposing the gate top hard mask 262. In some embodiments, the etch-back process may include a wet etch process, a dry etch process, a multiple-step etch process, and/or a combination thereof. It is noted that after the etch-back process, the gate spacers 264 remain disposed on sidewalls of the dummy gate stack 260.

Referring to FIGS. 1 and 13A-13C, the method 100 includes a block 122 where the source/drain regions of the fins 220 are recessed to form source/drain recesses 266. With the dummy gate stack 260 and the gate spacers 264 serving as an etch mask, the workpiece 200 is anisotropically etched to form the source/drain recesses 266 over the source/drain regions of the fins 220. In some embodiments, operations at the block 122 remove the epitaxial layers 214/216, as well as a top portion of the mesa 220B from the source/drain regions. In the illustrated embodiment, the source/drain recesses 266 extend into the mesa 220B and are below a top surface of the isolation feature 252. In furtherance of the embodiment, the source/drain recessed 266 extend below where the narrowest width (denoted as e in FIG. 13B) of the mesa 220B locates. That is, the remaining portions of the mesa 220B in the source/drain regions may have a narrowest width that is larger than its narrowest width in the channel region. The anisotropic etch at the block 122 may include a dry etching process. For example, the dry etching process may implement hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Referring to FIGS. 1 and 14A-14C, the method 100 includes a block 124 where inner spacers 268 are formed on lateral ends of the epitaxial layers 214. In some embodiments, a lateral etching (or horizontal recessing) is performed to recess the epitaxial layers 214 to form cavities on lateral ends of the epitaxial layers 214. The amount of etching of the epitaxial layers 214 may range from about 2 nm to about 10 nm. When the epitaxial layers 214 are SiGe, the lateral etching process may use an etchant, such as, but not limited to, ammonium hydroxide ($NH_4OH$), tetramethylammonium hydroxide (TMAH), ethylenediamine pyrocatechol (EDP), or potassium hydroxide (KOH) solutions. Subsequently, an insulating layer is deposited in the source/drain recesses 266 and fill the cavities on lateral ends of the epitaxial layers 214. The insulating layer may include a dielectric material, such as SiN, SiOC, SiOCN, SiCN, $SiO_2$, and/or other suitable material. In some embodiments, the insulating layer is conformally deposited, for example, by ALD or any other suitable method. After the conformal deposition of the insulating layer, an etch-back process is performed to partially remove the insulating layer from outside of the cavities. By this etching the insulating layer remains substantially within the cavities, thereby forming the inner spacers 268.

Referring to FIGS. 1 and 15A-15C, the method 100 includes a block 126 where epitaxial source/drain features 270 are formed in the source/drain recesses 266. In an embodiment, forming the epitaxial source/drain features 270 includes epitaxially growing one or more semiconductor layers by a molecular beam epitaxy (MBE) process, a chemical vapor deposition process, and/or other suitable epitaxial growth processes. In a further embodiment, the epitaxial source/drain features 270 are in-situ or ex-situ doped with an n-type dopant or a p-type dopant. For example, in some embodiments, the epitaxial source/drain features 270 include silicon doped with phosphorous for forming epitaxial source/drain features for an n-type FET. In some embodiments, the epitaxial source/drain features 270 include silicon-germanium (SiGe) doped with boron for forming epitaxial source/drain features for a p-type FET. The semiconductor layers of the epitaxial source/drain features 270 are selectively grown on different semiconductor surfaces exposed in the source/drain recesses 266, such as the lateral ends of the epitaxial layers 216. The bottom portion of the epitaxial source/drain features 270 fills the trench formed from recessing the mesa 220B. Accordingly, the sidewalls of the bottom portion of the epitaxial source/drain features 270 have a curvature shape. The narrowest width (denoted as e in FIG. 15B) of the epitaxial source/drain features 270 locates between the top surface of the isolation feature 252 and the top surface of the mesa 220B in the illustrated embodiment.

Referring to FIGS. 1 and 16A-16C, the method 100 includes a block 128 where an interlayer dielectric (ILD) layer 272 over the epitaxial source/drain features 270. A contact etch stop layer (CESL) (not shown) may also be formed under the ILD layer 272, in accordance with some embodiments. The CESL layer may include silicon nitride, silicon oxynitride, silicon nitride with oxygen (O) or carbon (C) elements, and/or other materials; and may be formed by CVD, PVD (physical vapor deposition), ALD, or other suitable methods. The ILD layer 272 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 272 may be formed by PECVD or FCVD (flowable CVD), or other suitable methods. In some embodiments, forming the ILD layer 272 further includes performing a CMP process to planarize a top surface of the device 200, such that the top surface of the dummy gate stack 260 is exposed.

Referring to FIGS. 1 and 17A-17C, the method 100 includes a block 130 where the dummy gate stack 260 and the epitaxial layers 214 are selectively removed. The dummy gate stack 260 exposed at the conclusion of the block 128 is removed from the workpiece 200 by a selective etching process. The selective etching process may be a selective wet etching process, a selective dry etching process, or a combination thereof. In the depicted embodiment, the selective etching process selectively removes the dummy dielectric layer and the dummy electrode without substantially damaging the epitaxial layers 216 and the gate spacers 264. The removal of the dummy gate stack 260 results in gate trenches 274 over the channel regions. After the removal of the dummy gate stacks 240, the epitaxial layers 214, epitaxial layers 216, and the cladding layer 226 in the channel regions are exposed in the gate trenches 274. Subsequently, operations at the block 130 selectively removes the epitaxial layers 214 from the gate trenches 274 to release the epitaxial layers 216. The selective removal of the epitaxial layers 214 may be implemented by selective dry etching, selective wet etching, or other selective etching processes. In some embodiments, the selective wet etching includes ammonium hydroxide ($NH_4OH$), hydrogen fluoride (HF), hydrogen peroxide ($H_2O_2$), or a combination thereof (e.g. an APM etch that includes an ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as $NH_4OH$. For the sake of simplicity and clarity, at the conclusion of the block 130, the epitaxial layers 216 are denoted as channel layers 216. At this point, vertically stacked channel layers 216 are formed in the channel regions of the to-be-formed GAA transistors.

Figure 18A:
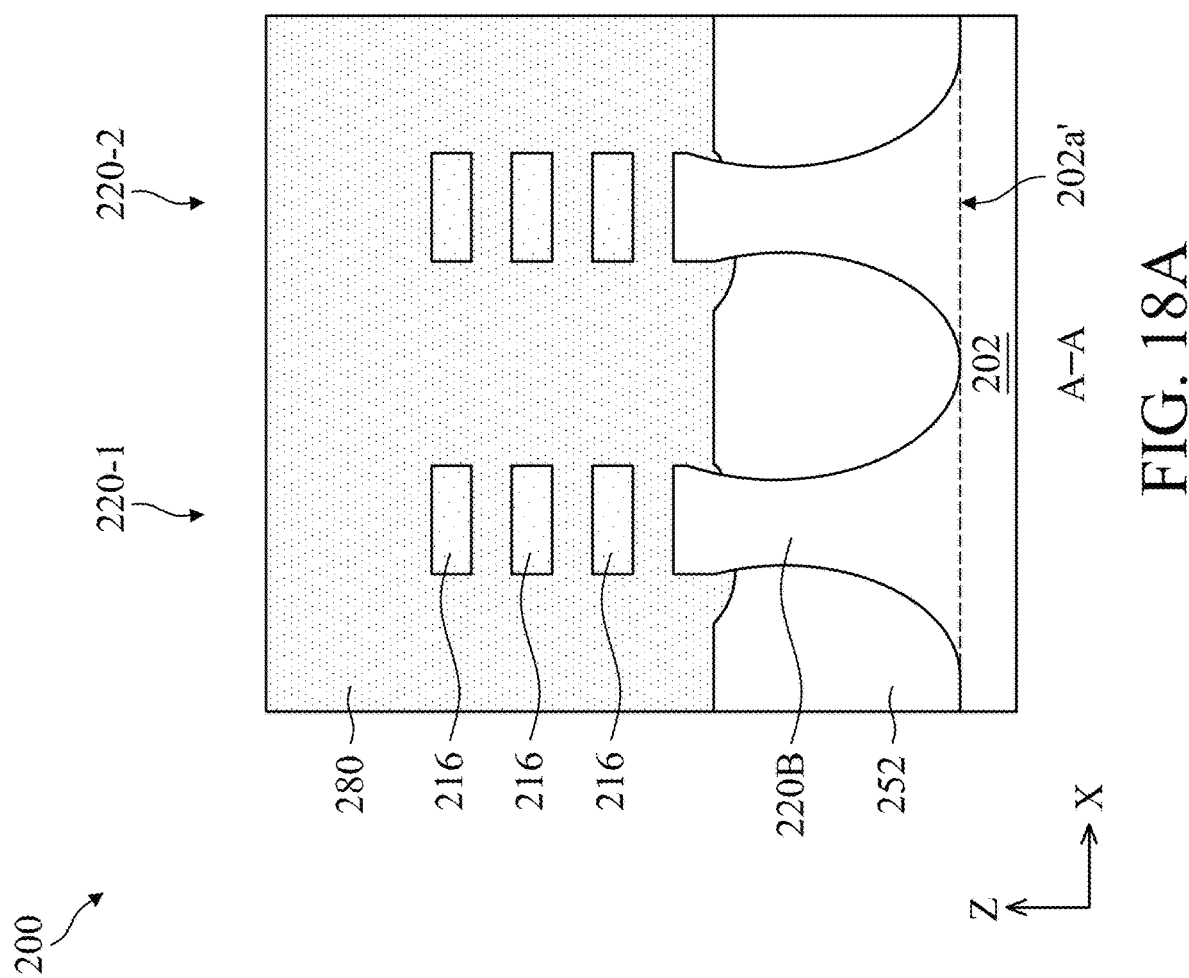
Figure 18C:
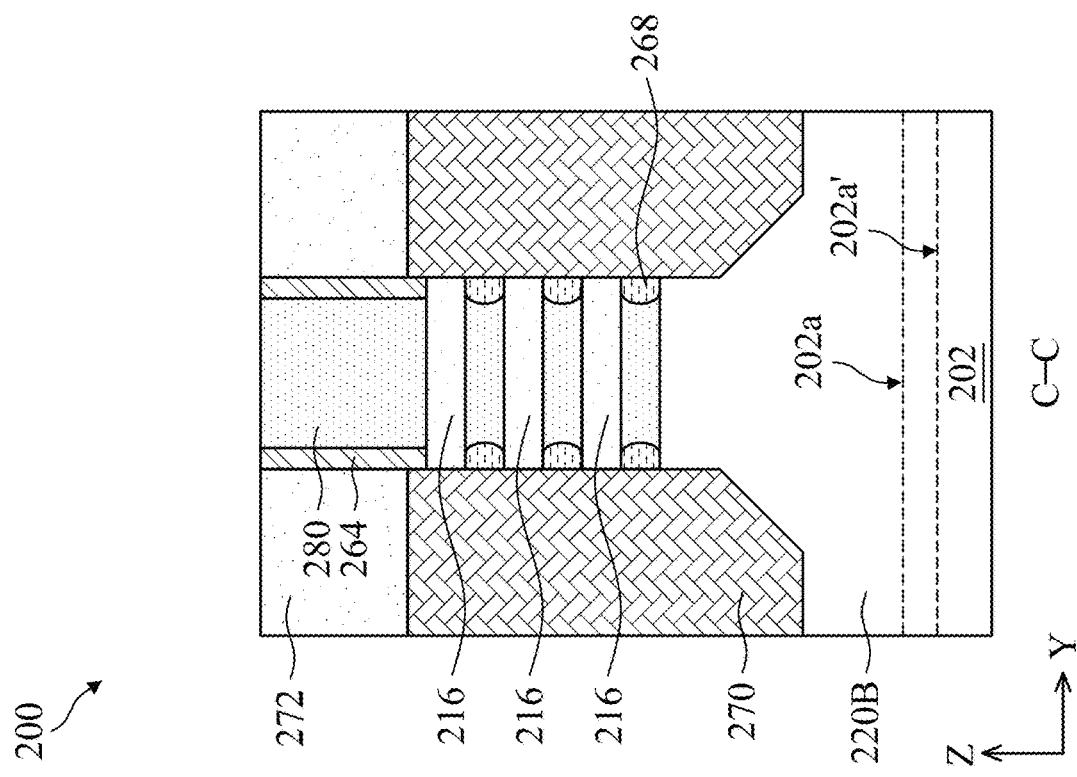
Figure 18B:
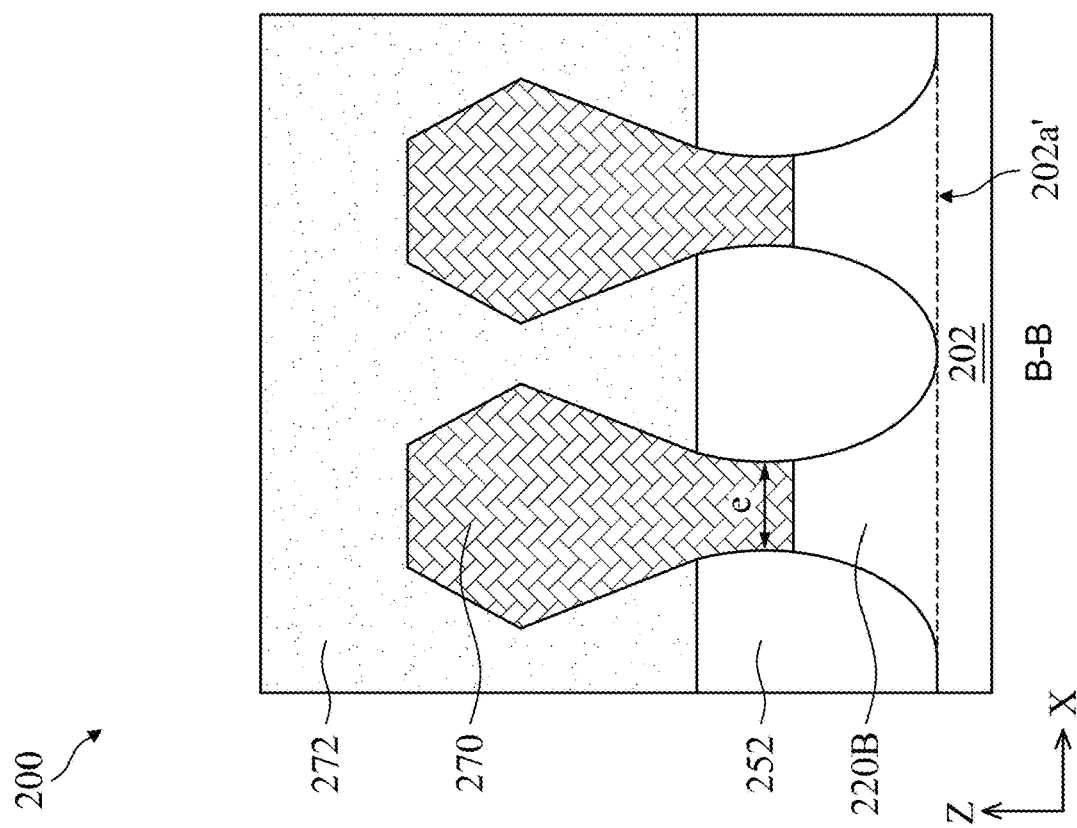

Referring to FIGS. 1 and 18A-18C, the method 100 includes a block 132 where a metal gate structure 280 is formed in the gate trench 274 wrapping each of the channel layers 216 in the channel region. The metal gate structure 280 also engages the top surface of the mesa 220B. A bottom portion of the metal gate structure 280 may extend along the curvature sidewalls of the mesa 220B to a position below the top surface of the isolation feature 252, as shown in FIG. 18A. Due to the modified sidewall profile, a portion of the metal gate structure 280 is directly under the mesa 220B. Besides, portions of the metal gate structure 280 that directly interface the sidewalls of the mesa 220B may be not leveled, such that one side extends further into the isolation feature 252 than another side. The inner spacers 268 separate the metal gate structure 280 from contacting the epitaxial source/drain features 270. Even there is still a contact area between the top portion of the mesa 220B and the metal gate structure 280, the cross-sectional area of the mesa 220B has been shrunk and the leakage current under the stacked channel layers is suppressed when the metal gate structure 280 applies a gate drive voltage to the top portion of the mesa 220B.

The metal gate structure 280 includes a gate dielectric layer wrapping each channel layers 216 in the channel region and a gate electrode layer formed on the gate dielectric layer. In some embodiments, the gate dielectric layer includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer includes an interfacial layer formed between the channel structures and the dielectric material. The gate dielectric layer may be formed by CVD, ALD or any suitable method. In one embodiment, the gate dielectric layer is formed using a highly conformal deposition process such as ALD in order to ensure the formation of a gate dielectric layer having a uniform thickness around each channel layers. The gate electrode layer is formed on the gate dielectric layer to surround each channel structure. The gate electrode layer includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer may be formed by CVD, ALD, electro-plating, or other suitable method. In certain embodiments of the present disclosure, one or more work function adjustment layers are interposed between the gate dielectric layer and the gate electrode layer. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

The workpiece 200 may undergo further processing to form various features and regions known in the art. For example, subsequent processing may form various contacts, vias, metal lines, and multilayers interconnect features (e.g., metal layers and interlayer dielectrics) on the workpiece 200, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multi-layer interconnection structure. Moreover, additional process steps may be implemented before, during, and after the method 100, and some process steps described above may be replaced or eliminated in accordance with various embodiments of the method 100.

Although not intended to be limiting, one or more embodiments of the present disclosure provide many benefits to a semiconductor device and the formation thereof. The present disclosure provides methods of forming a multi-gate device with channel layers suspended above a mesa that has concave sidewalls. Such sidewall profile increases resistance along current path through a mesa into a substrate. Accordingly, this provides a benefit of substrate leakage current suppression and reduced power consumption. Furthermore, the multi-gate device flow with adjusted mesa sidewall profile can be easily integrated into existing semiconductor fabrication processes.

In one exemplary aspect, the present disclosure is directed to a method of manufacturing a semiconductor device. The method includes forming a fin, the fin having an epitaxial portion and a base portion protruding from a substrate, sidewalls of the base portion being tapered with respect to sidewalls of the epitaxial portion, depositing a polymeric material on the sidewalls of the epitaxial portion, performing an etching process to modify a profile of the sidewalls of the base portion, such that the sidewalls of the base portion are laterally recessed with a narrowest width of the base portion located under a top surface of the base portion, removing the polymeric material from the sidewalls of the epitaxial portion, depositing an isolation feature on the sidewalls of the base portion, and forming a gate structure engaging the epitaxial portion. In some embodiments, the forming of the fin includes forming an epitaxial stack of channel layers and sacrificial layers on the substrate, the channel layers and the sacrificial layers having different material compositions and being alternatingly disposed in a vertical direction, patterning the epitaxial stack in a first etching process, thereby forming the epitaxial portion, and patterning a top portion of the substrate in a second etching process that is different from the first etching process, thereby forming the base portion. In some embodiments, the depositing of the polymeric material is during the first etching process. In some embodiments, the polymeric material comprises a fluorine-containing polymer. In some embodiments, the fluorine-containing polymer comprises $C_wH_xF_yO_z$, w, x, y, and z representing atomic percentages of C, H, F, and O, respectively. In some embodiments, after the performing of the etching process, the sidewalls of the base portion have a curvature shape bending towards a center of the base portion. In some embodiments, after the performing of the etching process, a ratio of the narrowest width of the base portion and a width of the top surface of the base portion ranges from about 0.5 to about 0.9. In some embodiments, after the depositing of the polymeric material, along the sidewalls of the epitaxial portion from top to bottom, a thickness of the polymeric material generally decreases. In some embodiments, after the forming of the gate structure, a portion of the gate structure extends below a top surface of the isolation feature. In some embodiments, the portion of the gate structure is directly under a top surface of the base portion.

In another exemplary aspect, the present disclosure is directed to a method of manufacturing a semiconductor device. The method includes forming an epitaxial layer on a substrate, patterning the epitaxial layer and a top portion of the substrate to form a fin-shape epitaxial layer and a mesa under the fin-shape epitaxial layer, respectively, depositing a polymer layer covering sidewalls of the fin-shape epitaxial layer, performing an etching process to laterally recess sidewalls of the mesa, such that a width of the mesa is smaller than a width of the fin-shape epitaxial layer, removing the polymer layer to expose the sidewalls of the fin-shape epitaxial layer, and forming a gate structure on the fin-shape epitaxial layer. In some embodiments, a ratio of the width of the mesa and the width of the fin-shape epitaxial layer is in a range of about 0.5 to about 0.9. In some embodiments, prior to the performing of the etching process, the sidewalls of the fin-shape epitaxial layer are substantially vertical and the sidewalls of the mesa are tapered. In some embodiments, after the performing of the etching process, the sidewalls of the mesa have a concave profile. In some embodiments, the method further includes after the removing of the polymer layer, forming an isolation feature on the sidewalls of the mesa, a narrowest width of the mesa locating under a top surface of the isolation feature. In some embodiments, the method further includes recessing a top surface of the mesa to a position below where the narrowest width locates, and epitaxially growing a source/drain feature from the recessed top surface of the mesa. In some embodiments, the gate structure directly interfaces a top surface of the mesa.

In another exemplary aspect, the present disclosure is directed to a semiconductor device. The semiconductor device includes channel layers disposed over a mesa, sidewalls of the mesa bending inwardly towards a center of the mesa such that a width of a middle portion of the mesa is narrower than a width of a top portion of the mesa, a gate structure wrapping each of the channel layers and in physical contact with the mesa, an epitaxial source/drain feature abutting the channel layers, and an isolation feature deposited on sidewalls of the mesa and sidewalls of the epitaxial source/drain feature. In some embodiments, an upper portion of the sidewalls of the mesa has a vertical profile and a lower portion of the sidewalls of the mesa has a curvature profile. In some embodiments, a narrowest width of the epitaxial source/drain feature locates under a top surface of the isolation feature.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of manufacturing a semiconductor device, comprising:
   forming a fin, the fin having an epitaxial portion and a base portion protruding from a substrate, wherein sidewalls of the base portion have a tapering profile with respect to sidewalls of the epitaxial portion;
   depositing a polymeric material on the sidewalls of the epitaxial portion;
   performing an etching process to modify the sidewalls of the base portion to transit from the tapering profile to a curved profile, such that the sidewalls of the base portion are laterally recessed with a narrowest width of the base portion located under a top surface of the base portion while the sidewalls of the epitaxial portion remain intact, wherein the substrate remains being exposed during the transition from the tapering profile to the curved profile;
   removing the polymeric material from the sidewalls of the epitaxial portion;
   depositing an isolation feature on the sidewalls of the base portion; and
   forming a gate structure engaging the epitaxial portion.

2. The method of claim 1, wherein the forming of the fin comprises:
   forming an epitaxial stack of channel layers and sacrificial layers on the substrate, the channel layers and the sacrificial layers having different material compositions and being alternatingly disposed in a vertical direction;
   patterning the epitaxial stack in a first etching process, thereby forming the epitaxial portion; and
   patterning a top portion of the substrate in a second etching process that is different from the first etching process, thereby forming the base portion.

3. The method of claim 2, wherein the depositing of the polymeric material is during the first etching process.

4. The method of claim 1, wherein the polymeric material comprises a fluorine-containing polymer.

5. The method of claim 4, wherein the fluorine-containing polymer comprises $C_wH_xF_yO_z$, wherein w, x, y, and z represent atomic percentages of C, H, F, and O, respectively.

6. The method of claim 1, wherein after the performing of the etching process, the sidewalls of the base portion have a curvature shape bending towards a center of the base portion.

7. The method of claim 1, wherein after the performing of the etching process, a ratio of the narrowest width of the base portion and a width of the top surface of the base portion ranges from about 0.5 to about 0.9.

8. The method of claim 1, wherein after the depositing of the polymeric material, along the sidewalls of the epitaxial portion from top to bottom, a thickness of the polymeric material generally decreases.

9. The method of claim 1, wherein after the forming of the gate structure, a portion of the gate structure extends below a top surface of the isolation feature.

10. The method of claim 9, wherein the portion of the gate structure is directly under a top surface of the base portion.

11. A method of manufacturing a semiconductor device, comprising:
    forming an epitaxial layer on a substrate;
    patterning the epitaxial layer and a top portion of the substrate to form a fin-shape epitaxial layer and a mesa under the fin-shape epitaxial layer, respectively;
    after the fin-shape epitaxial layer and the mesa are formed, depositing a polymer layer covering sidewalls of the fin-shape epitaxial layer and over a top surface of the fin-shape epitaxial layer;
    performing an etching process to laterally recess sidewalls of the mesa, such that a width of the mesa is smaller than a width of the fin-shape epitaxial layer;
    removing the polymer layer to expose the sidewalls of the fin-shape epitaxial layer; and
    forming a gate structure on the fin-shape epitaxial layer.

12. The method of claim 11, wherein a ratio of the width of the mesa and the width of the fin-shape epitaxial layer is in a range of about 0.5 to about 0.9.

13. The method of claim 11, wherein prior to the performing of the etching process, the sidewalls of the fin-shape epitaxial layer are substantially vertical and the sidewalls of the mesa are tapered.

14. The method of claim 11, wherein after the performing of the etching process, the sidewalls of the mesa have a concave profile.

15. The method of claim 11, further comprising:
after the removing of the polymer layer, forming an isolation feature on the sidewalls of the mesa, wherein a narrowest width of the mesa is located under a top surface of the isolation feature.

16. The method of claim 15, further comprising:
recessing a top surface of the mesa to a position below where the narrowest width is located; and
epitaxially growing a source/drain feature from the recessed top surface of the mesa.

17. The method of claim 11, wherein the gate structure directly interfaces a top surface of the mesa.

18. A method, comprising:
forming an epitaxial stack of channel layers and sacrificial layers over a substrate, the channel layers and the sacrificial layers having different material compositions and being alternatingly disposed in a vertical direction;
patterning the epitaxial stack and a top portion of the substrate to form a patterned epitaxial stack and a fin-shaped base, respectively;
reshaping sidewalls of the fin-shaped base, such that a middle portion of the sidewalls of the fin-shaped base bends inwardly toward a center of the fin-shaped base while a top portion of the sidewalls of the fin-shaped base remains intact, wherein during the reshaping from start to end the substrate remains being exposed;
depositing an isolation feature on the reshaped sidewalls of the fin-shaped base;
removing the sacrificial layers to release the channel layers; and
forming a metal gate structure wrapping around each of the channel layers.

19. The method of claim 18, wherein after the reshaping of the sidewalls of the fin-shaped base, a width of a middle portion of the fin-shaped base is narrower than a width of a top portion of the fin-shaped base.

20. The method of claim 18, further comprising:
recessing the patterned epitaxial stack and the fin-shaped base in a source/drain region; and
forming an epitaxial source/drain feature in the source/drain region, wherein the epitaxial source/drain feature abuts the channel layers, and wherein a narrowest width of the epitaxial source/drain feature is located under a top surface of the isolation feature.

* * * * *